United States Patent [19]
Lee et al.

[11] Patent Number: 5,835,420
[45] Date of Patent: Nov. 10, 1998

[54] NODE-PRECISE VOLTAGE REGULATION FOR A MOS MEMORY SYSTEM

[75] Inventors: Peter W. Lee, Saratoga, Calif.; Hsing-Ya Tsao; Fu-Chang Hsu, both of Taipei, Taiwan

[73] Assignee: Aplus Flash Technology, Inc., Saratoga, Calif.

[21] Appl. No.: 884,251

[22] Filed: Jun. 27, 1997

[51] Int. Cl.[6] ........................................................ G11C 7/00

[52] U.S. Cl. .............................. 365/189.09; 365/189.11; 365/189.07

[58] Field of Search ........................ 365/189.09, 189.11, 365/189.07; 327/534, 535, 538, 539

[56] References Cited

U.S. PATENT DOCUMENTS

| | | | |
|---|---|---|---|
| 5,508,604 | 4/1996 | Keeth | 365/189.09 |
| 5,511,026 | 4/1996 | Cleveland et al. | 365/189.09 |

*Primary Examiner*—Vu A. Le

*Attorney, Agent, or Firm*—Flehr Hohbach Test Albritton & Herbert LLP

[57] ABSTRACT

An on-chip system receives raw positive and negative voltages from voltage pumps and provides CMOS-compatible bandgap-type positive and negative reference voltages from at least one of which regulated positive and negative Vpp and Vpn voltages are generated. A bitline (BL) regulator and a sourceline (SL) regulator receive Vpp and generate a plurality of BL voltages and SL voltages, and use feedback to compare potential at selected BL nodes and SL nodes to a reference potential using a multi-stage differential input differential output comparator. Reference voltages used to create BL and SL potentials may be varied automatically as a function of addressed cell locations to compensate for ohmic losses associated with different cell array positions. The system includes positive and negative word-line (WL) regulators that each use feedback from selected WL nodes. The system further includes a WL detector and magnitude detector for Vdd and Vpp, and can accommodate multiple level memory (MLC) cells by slewing reference voltages used to output regulated voltages. The system preferably is fabricated on the same IC chip as the address logic and memory array using the regulated potentials.

34 Claims, 24 Drawing Sheets

NODE-PRECISE VOLTAGE REGULATION FOR A MOS MEMORY SYSTEM

RELATIONSHIP TO PENDING APPLICATION

Applicants' U.S. patent applications Ser. No. 08/744,200 filed on Nov. 5, 1996, entitled POSITIVE/NEGATIVE HIGH VOLTAGE CHARGE PUMP SYSTEM, and Ser. No. 08/772,232 filed on Dec. 23, 1996, entitled PRECISE MEDIUM VOLTAGE HIGH CURRENT CHARGE PUMP SYSTEM disclose a number of high voltage pump circuits that may be adapted for use with the present invention.

FIELD OF THE INVENTION

The present invention relates generally to charge pump systems that provide precisely regulated voltage levels for programming, erasing, and verification for flash EPROM and EEPROM cells, and more specifically to improving regulation of such voltages where they are needed, directly at the memory cell source, drain, and gate nodes and on-chip Vdd and Vpp pins receiving the voltage.

BACKGROUND OF THE INVENTION

Flash electrically programmable read only memories ("EPROMs") and flash electrically erasable and programmable read only memories ("EEPROMs") are solid state devices that can persistently store digital data. As shown by FIG. 1, an EPROM-type flash cell 10 typically has a metal-on-silicon ("MOS") structure that includes a substrate 12, source and drain regions 14, 16, a floating gate 18 overlying MOS channel region 20 but separated therefrom by a thin layer region 22 of oxide 24. A control gate 26 is formed overlying floating gate 18. For a flash EPROM, it is necessary to surround the source region with a lightly doped region 15 of like-conductivity type dopant. The substrate or bulk 12 is tied to a potential Vbb that typically is ground.

For the NMOS device depicted, substrate 12 is doped with P-type impurities, and the source and drain regions are doped with N-type impurities. For a flash EPROM, N+ source region 14 is surrounded by an N- region 15. The N- region 15 is included to protect the source junction from the large source-floating gate electric field used to electrically erase the cell. This N- region helps reduce electric field magnitude between source nodes and the first polysilicon layer (not shown) during erase operations.

Of course a PMOS device may be formed by substituting an N-type substrate, and P-type source, drain regions. Generally, NMOS devices are preferred to PMOS devices in that the majority carriers in NMOS devices, electrons, have 2.5 times the mobility of the majority carriers, holes, in PMOS devices, and thus can operate more rapidly. Although an EPROM-type flash cell is depicted, it is to be understood that the present invention may also be used with EPROM, or EEPROM type memory as well.

A Vcg voltage coupled to control gate 26 can affect charge stored on floating gate 18, which charge affects the Vt threshold voltage of MOS device 10. The magnitude of charge on the floating gate controls the minimum (or Vt) voltage Vcg that will turn-on device 10, causing drain-source current to flow across the channel region 20. Device 10 is programmed to one of two states by accelerating electrons from substrate channel region 20 through the thin gate dielectric 22 region onto floating gate 18.

The state of device 10, e.g., how much charge is stored on floating gate 18, is read by coupling an operating voltage Vds across source and drain regions 14, 16. The drain-source current Ids is then read to determine whether data stored in the device is a logic level one or zero for a given control voltage level Vcg. The two logic states may be differentiated by sensing relative current levels, e.g., perhaps 100 µA versus 10 µA.

Two mechanisms are in common use to program a flash EPROM (or to erase a flash EEPROM, whose definitions of erasing and programming are opposite), namely channel-hot-electron ("CHE") injection, and Fowler-Nordheim ("FN") tunnelling. Commonly, EPROM-flash devices use FN-erase mode and CHE-program mode operations, which combination is sometimes referred to as ETOX, for EPROM tunnel oxide technology. On the other hand, EEPROM-flash devices commonly use FN-erase mode, and FN-program mode operations.

Table 1 summarizes the application of FN and CHE modes, as well as typical cell voltages for gate, source and drain nodes. As described later herein, the present invention is directed to a medium high voltage pump that can increase a lower Vdd voltage to approximately 5 VDC at high current for coupling to the source or drain of cells to be erased or programmed.

TABLE 1

|  | ERASE | PROGRAM |
|---|---|---|
| EPROM-flash | FN:<br>G = -8V, S = 5V, D = float | CHE:<br>G = 8V, S = 0V, D = 5V |
| EEPROM-flash | FN:<br>G = 15V, S = 0V, D = 0V | FN:<br>G = -8V, S = 5V, D = float |

Thus, for the EPROM-flash cell depicted in FIG. 1, channel-hot-electron injection is used to program the cell to an off-state in read mode. Using CHE technology, is necessary to apply a positive high voltage Vcg, e.g., perhaps +8 VDC to +10 VDC to control gate 26, while applying perhaps +5 VDC to drain 16, and 0 VDC to source 14. As hot electrons are accelerated and travel from source to drain, the electric field created by the high Vgs and Vds voltages can pull some hot electrons from the drain to the floating gate. (No electrons will be pulled to the floating gate from the source, which is at ground potential.) When using CHE injection, the drain-source channel current will be approximately 0.5 mA/cell.

Using FN technology, an EPROM-flash cell is erased by coupling perhaps -8 VDC to the control gate 26, +5 VDC to the source, and allowing the drain to float. FN-mode erasing can be accomplished with a tunnel current of approximately 10 nA/cell. (Although one can erase an EPROM-flash cell by providing positive high voltage to the source and grounding the control gate, so doing increases source region junction leak current, and increases hot-hole injection at the source region.)

To program an EEPROM-flash cell using FN technology requires applying approximately -8 VDC to control gate 26, applying +5 VDC to source 14, and floating drain 16. The negative Vcg high voltage and Vs produce a large tunnel electric field that can push electrons from the floating gate 18 to the source 14. (No electrons are pulled out of the floating gate to the drain, as the floating drain will not generate a large electric field.) Unfortunately, this causes hole trapping, and degrades the storage capability and endurance of the memory cell. To erase an EEPROM cell using FN technology, approximately +15 VDC is applied to control gate 26, while drain 16 and source 14 are grounded. As was the case for an EPROM-flash cell, FN erasing can be accomplished with a tunnel current of approximately 10 nA/cell.

Typically the circuitry with which memory cells 10 are used is powered by a single low voltage power supply, a 3.3 VDC battery for example, although batteries ranging from perhaps 1.2 VDC to 5 VDC or higher may instead be used. Positive and negative high voltage pump circuits are commonly used to generate the ±12 V ($VP_{Pp}$, $V_{Pn}$) or so high voltage necessary to program and erase memory cells from a single lower voltage power supply. In the prior art, separate medium voltage pump circuits are used to generate the +5 V or so ($V_{Pm}$) that must be supplied at relatively higher current levels in the few mA range. Usually the source shares a pump circuit with the drain, as the voltages required are the same but are used during different operation modes.

From the foregoing discussions of CHE and FN mechanisms, it will be appreciated that the number of cells that can be erased or programmed in parallel, e.g., simultaneously (or in a "flash"), will often be determined by the pump circuit current output characteristics. For example, if a medium voltage $V_{Pm}$ pump circuit can provide an average 8 mA output current drain-source, 16 bits can be programmed simultaneously, whereas 100 Kbytes may be erased simultaneously.

Understandably, in designing pump circuits it is important that sufficient program or erase current be provided to at least meet the cell requirements to maintain erasing and programming efficiency. In a system with a 5 VDC power supply (Vdd=5 VDC), 32-bit programming can be achieved, but if Vdd=3 VDC, only 8-bit programming can presently be achieved. It simply is difficult in ETOX systems to provide sufficient 0.5 mA/cell program current at 5 VDC drain voltage when Vdd is less than about 3 VDC. Further, it is necessary to pump a 3 VDC Vdd up to 5 VDC, preferably using an on-chip pump circuit, to even meet the 0.5 mA/cell programming requirements. If an externally created 5 VDC Vdd is available, it may of course provide multiple byte-programming, e.g., four-byte, without recourse to an on-chip high current pump. At present, FN-programming dominates sub-3 VDC Vdd systems, whereas CHE-programming dominates 5 VDC Vdd flash memory systems.

However, in some systems an external source of Vpp may be provided, in which case there is no need to provide an on-chip positive voltage Vpp pump. The presence of an external Vpp supply can result in faster and more efficient erase and program mode operations. Although modern flash memory systems can be operated from a variety of power supplies and power supply values, such systems do not include an accurate on-chip Vdd and Vpp voltage detector. Possibly this is because traditionally Vdd was always 5 V and Vpp was 12 V, but modern flash technology may use values of Vdd that are 1.8 V, 2.2 V, 2.5 V, 3.3 V or 5 V, whereas Vpp may be 12 V or 5 V or 33 V. Conventional on-chip Vdd and Vpp detectors did not include a stable voltage reference for use in detection comparison.

As a result, Vdd and Vpp detection accuracy varied with temperature and with fabrication process, which impacted the usefulness of Vdd and Vpp level detection. As shown in FIG. 2, it is common to form an integrated circuit ("IC") 100 that includes a plurality of cells 10 that are arrayed in addressable rows and columns that define a storage array 110. Address logic 120 permits accessing a specific cell in such an array. For example, during a program/read or erase operation, a given cell 10 may be accessed by applying the proper Vgs, Vd, Vs potentials to all cells in a column containing the addressed cell, and to the row containing the addressed cell.

Commonly, a horizontal row of cells having their control gates tied-together defined a word line ("WL"), whereas a vertical column of cells having their drains tied-together define a bit line ("BL"). Source leads in a block of cells are tired-together to define a source line ("SL"). Changing the WL, BL, SL potential for a selected group of cells enables those cells to be programmed or erased or verified. For ease of illustration, address logic 120 is shown as having a single output lead, but in practice there will be multiple output leads, including leads for Vgs, Vd, and Vs.

In typical arrays, the gate node of cells 10 are coupled to a WL by a polysilicon conductor, as zero DC current will be carried by the WL. The cell drain nodes are coupled to a typically metal BL, and the source nodes are coupled to a SL, typically via an N+ diffusion. Whereas the WL carries zero DC current, the BL may carry a total 5 mA DC if eight cells in the same WL are simultaneously programmed. The eight BLs typically will come from eight respective sub-groups, in which but a single BL is selected from each sub-group. Further, a SL may carry upwards of 5 mA DC current if 64 Kbytes of cells are collectively erased simultaneously. There will typically be a great many SLs, and the SLs may be combined into sub-groups.

The WLs are coupled to a row-selected device by an row decoder (or X-decoder), which for ease of illustration may be assumed to be associated with address logic unit 120 in FIG. 2. The BLs are coupled to a column-selected device driven by a column decoder (or Y-decoder), which is assumed to be associated with address logic 120. The SLs are coupled to source control circuit, assumed to be associated with address logic unit 120. If array 120 includes 1 Mbit of flash memory cells, there will be 1,024 WLs and 1,024 BLs configured in horizontal rows and vertical columns, in which two WLs typically share one SL.

In FIG. 2, IC 100 preferably operates from a single low voltage power supply Vdd, perhaps a 5 VDC battery, although the trend has been toward Vdd values of 3.3 VDC or 2.5 VDC, with a goal of perhaps 1.2 VDC.

To generate the high voltage necessary to program or erase the various cells from a lower voltage Vdd supply, voltage pump circuits are used. IC 100 will commonly include a positive high voltage pump circuit 130 that outputs a high positive potential $V_{pp}$ and a negative high voltage pump circuit 140 that outputs a high negative potential $V_{pn}$. A medium voltage circuit 145 is also used to output a medium high voltage $V_{pm}$ (perhaps +5 V at relatively higher current levels, e.g., ≈5 mA) than are associated with voltages $V_{pp}$ and $V_{pn}$.

Because the various pump output voltages are not especially well regulated, voltage regulator circuits 132, 142, 147 are also provided. Typically these circuits employ a constant voltage reference such as a bandgap generator. The output voltages from the voltage regulators will be logically presented to selected groups of cells to provide WL, BL, SL potentials as required by the various modes of operation, as exemplified by the values shown in TABLE 1.

Unfortunately, although regulators 132, 142, 147 may do an acceptable job of regulating voltage at the output ports of the voltage regulators, the WL, BL, SL voltages may not be especially well regulated where the voltages are needed: at the gate, drain, and source nodes of the selected memory cells. Such feedback as is used by prior art regulators 132, 142, 147 is typically internal to regulator itself, e.g., a scaled proportion of the voltage at the output port of the regulator is compared to the reference voltage and the output port voltage is adjusted accordingly. However, feedback from the nodes whereat the voltage should be tightly regulated (e.g., the cell nodes) is not employed.

Many factors contribute to variations in WL, BL, and SL potentials as they appear at the nodes of the selected cells. In practice, WL regulation is less troublesome than BL and SL regulation. Because the WL is coupled to the control gate nodes of selected memory cells, no DC current is drawn. However, WL voltage can vary in verification mode due to device body-effect coupling at the X-decoder. The result is that WL voltage varies due to threshold Vt shifts. In contrast to the minimal WL current requirements, BL and SL may each carry perhaps 5 mA of DC current. Ohmic IxR type losses in the BL and SL conductive lines from the regulator outputs to the selected array cell nodes can degrade quality of the voltage regulation, and thus reliability of a program or erase operation.

The voltage-changing effects of parasitic active resistances and column select devices can vary from one select path to another, further causing variations in the voltages actually seen by the selected cells. Temperature variations and fabrication process variations can result in some individual memory cells 10 being erased or programmed more effectively within a given amount of time by the WL, BL, SL potentials seen by the cells, than other cells. Essentially, the erase and program currents required can vary from cell to cell. Further, a cell's program and erase Vt can dynamically vary over time during program and erase operations, which will affect current in that cell.

The above-enumerated factors and other uncontrollable effects contribute to make the voltages actually seen at the drain and source nodes of selected memory cells difficult to reliably predict. Consequently, program and erase operations can be unduly stressful to the memory array, and efficiency of such operations will be degraded, to the detriment of product life of the memory system. Thus, it is common to provide a verify mode to confirm effectiveness of an erase or program operation.

For example, in program verifying mode, potential for the selected WL may be about +2 V for a low threshold voltage ("Vt") memory cell, and perhaps +6 V for a high Vt memory cell. In program verifying mode, the BL will be about +1 V, and the SL will be grounded (for 5 V Vdd operation).

In erase verifying mode, the selected WL is set to +3 V to verify Vt for the cell after erasure, while the WL is set to +1 V to verify cell Vt following erase repair operation.

Table 2 below recapitulates the various BL, WL, and SL potentials commonly encountered, although larger magnitude potentials may also be found.

TABLE 2

|  | BL (drain) | WL (gate) | SL (source) |
|---|---|---|---|
| Erase: | floating | −8V | +5V |
| Program: | +5V | +8V | 0V |
| Erase verify: | +1V | +3V | 0V |
| Reading: | +1V | +Vdd | 0V |
| Program verify: | +1V | +6.5V | 0V |
| Erase repair: | +5V | >+1V | 0V |

However, the efficiency of program and erase and verify mode operations is dependent upon the accuracy with which the various programming, erasing, or verifying voltages can be maintained, as seen by the selected cell gate, drain, and source leads. Maintaining a well regulated voltage is especially important for read and verify modes. However, as noted, prior art voltage regulation schemes as shown in FIG. 2 do not actually regulate the WL, BL, SL potentials at the memory cell nodes. Accurately regulating WL, BL, SL potentials becomes more critical as MOS device sizes become smaller. For example, in the past, 1 $\mu$m MOS devices could tolerate perhaps ±10% tolerance or so on the magnitude of these voltages. But for modern 0.3 $\mu$m MOS devices, the same 10% tolerance, especially when combined with other variations, can push the MOS devices beyond acceptable tolerances. Thus, it is especially important to regulate WL, BL, and SL potentials as device sizes continue to shrink.

Understandably, applying too much potential to a WL, BL, SL can stress if not destroy memory cells. On the other hand, under potential can result in false reads and incomplete erasures. Thus, efficient programming, erasing, and verifying a memory array requires tightly control WL, BL, and SL potentials, at the cell nodes coupled to these lines.

IC 100 also includes a phase generator circuit 125 that outputs a plurality of non-overlapping different phase pulse trains (here denoted ø1, ø2, ø3, ø4) that drive the positive and negative pump circuits 130, 140, 145.

In typical flash memory applications, an erase time of 1 second is regardless of the number of flash memory cells, e.g., cells 10, being erased. However, in practice, the magnitude of the erase current can limit the number of cells or memory bits that can be erased simultaneously. A typical flash memory cell, e.g., cell 10, may require about 10 nA during erase mode operation, and about 0.5 mA during program mode operation. Stated differently, programming current required by a typical memory cell exceeds erase current by about 50,000:1. Because of this current limitation, it is common to block erase 64 Kbits simultaneously, while programming is directed to one byte (e.g., 8 bits) at a time. Typically, to program a byte requires about 0.5 mA/cell×8 cells≈4 mA at about 5 VDC. Approximately the same current is required to erase a block of 64 KBytes, e.g., 10 nA/cell×64 KByte cells 5 mA. Since simultaneous block erase and byte programming would not occur, a single medium voltage pump circuit capable of approximately 5 mA output at $V_{Pm}$ can suffice.

It will now be appreciated reliable program, erase, and verify operations require tightly regulate WL, BL, SL potentials at the selected memory cell gates, drains, and sources. However from the foregoing it is apparent that prior art approaches have regulated these potentials tightly at the output port of the various voltage regulators, without accounting for variations in these regulated potentials downstream from the regulator output ports.

However, such regulation as is carried out in the prior art leaves much to be desired. For example, Tedrow et al. in U.S. Pat. No. 5,546,042 discloses a voltage regulator for flash memory in which a resistor divider scales-down the regulated voltage to a level appropriate for a voltage comparator. Unfortunately, the resistor divider draws DC current, which can not readily be spared from the pump circuit whose voltage is being regulated. Further, the divider attenuates changes in the regulated voltage, degrading gain of the regulation system such that a precise voltage at the output of the voltage comparator does not ensure a precise output voltage. What would be more desirable is a regulation method that did not draw DC current, and that could pass to a voltage comparator input essentially all (rather than a fraction of) change in the pump voltage to be regulated.

Although U.S. Pat. No. 5,291,446 to Van Buskirk et al. discloses regulation of a positive potential using capacitive voltage division, Van Buskirk's voltage division also downscales the error or delta component on the voltage being divided, thus reducing overall regulation efficiency. Further, error occurs in Van Buskirk's capacitor division due to leakage currents. Buskirk also generates a first program mode output and a second program-verify mode output, by changing the capacitor-divide ratio. This approach requires an extra capacitor, and becomes less efficient if multiple output voltage levels are required. What would be more useful would be a regulator in which programmable references create programmable output potentials.

U.S. Pat. No. 4,858,186 to Jungroth discloses an open loop circuit for providing a load for charging an EPROM cell. Jungroth does not use a comparator to detect differences between a reference and the desired regulated voltage, but instead directly applies a fixed control voltage to a source follower whose output is to control selected BL voltage. Unfortunately, if BL potential is too low, Jungroth cannot compensate. Jungroth attempts to use a reference column to generate a fixed control voltage. An assumption is made that the reference column should mimic the selected BL, and that by setting reference column voltage and current to desired values, the selected BL should follow suit. However this scheme is deficient because the circuit and layout of the reference column differ substantially from the BL; for example, the reference column has no memory cell (whose channel current can vary 10:1 during programming, to significantly alter BL potential). As a result, relatively poor BL voltage regulation is provided by this prior art approach.

In summary, there is a need for a system of regulation of WL, BL, and SL potentials that provides the necessary regulation where it is needed, at the gate, drain, and source leads of the selected memory cells. Preferably the voltages delivered at these nodes should be regulated so as to be substantially independent of process and fabrication variations, ambient temperature variations, and Vcc or Vdd power supply variations. In achieving these design goals, preferably a measure of the desired voltage at the selected cell nodes should be taken and fedback to the appropriate voltage regulator.

Since an array can include thousands of BLs and SLs, a mechanism for detecting and regulating only the cell node potentials for the selected BLs and SLs should be implemented to save IC chip area required by the implementation. Because modern flash memory systems can be operated from a variety of power sources, there is a need for a system that includes an accurate on-chip Vdd and Vpp voltage detector, such that detection accuracy is independent of ambient temperature and fabrications process.

On-chip accurate detection of Vdd and Vpp levels can help fine-tune performance of on-chip regulators. For example, amplitude of the phase generated clock pulses may vary substantially with Vdd power supply variation, and the ability to detect Vdd and fine-tune on-chip pump voltages accordingly can be advantageous. Further, on-chip detection of Vdd and Vpp may be used to disable on-chip voltage pumps, e.g., a Vpp pump, that need not be operated because the system environment provides the necessary magnitude of Vpp. An on-chip Vpp detector could sense the presence of an external source of Vpp and provide a control signal disabling an on-chip Vpp voltage pump. However, existing on-chip Vdd and Vpp detectors are relatively inaccurate and vary in performance with ambient temperature and fabrication process variations. Thus, there is a need for an on-chip accurate Vdd and Vpp detector circuit, whose detection accuracy is substantially independent of ambient temperature and fabrication process.

The present invention provides such a voltage regulation system.

SUMMARY OF THE PRESENT INVENTION

The present invention finely regulates WL (positive and negative), BL, and SL voltages in a manner equivalent to regulating voltages at the actual nodes of gate, drain, and source leads of selected memory cells within a solid state array. The various regulators are fabricated on the same IC chip containing the array, along with ancillary circuitry such as precision CMOS-implemented band-gap-type positive and negative reference voltage generators, VREF(P) and VREF(N), and a precise Vdd/Vpp detector.

The invention provides a Vpp regulator that is powered by raw Vpp from a positive voltage pump. The Vpp regulator regulates positive high voltage and includes a preferably at least two-stage differential input differential output voltage comparator, a voltage controller, and a voltage divider. A voltage-divided fraction of the output Vpp voltage and VREF(P) are input to the first comparator stage, whose differential output is coupled to the second comparator stage. A single-ended second comparator stage output is coupled to a voltage controller operating from the raw Vpp, receives the comparator output and outputs regulated Vpp, which is also coupled to the divider.

The differential input-differential output first comparator stage operates at relatively low voltage gain but advantageously cancels the effects of variations in power supply, ambient temperature and fabrication process in its output signals. The following comparator stage(s) provide high gain, and exhibit high performance that is substantially independent of power supply, temperature, and process variation. Further, the comparator is advantageously operable from Vdd potential and provides overall high gain even when the input stage operates in linear mode. As noted, comparator output is coupled via a voltage controller to directly drive the voltage regulated output. This configuration promote high loading and high current drive capability.

In a preferred embodiment, the divider includes a MOS-switched resistor series pair and a coupling capacitor, coupled such that the divider does not conduct DC current. The resistor pair establishes an initial downscaled voltage commensurate with VREF(P) for the comparator input, after which the resistors are decoupled, allowing changes in the Vpp voltage that was scaled to be coupled to the comparator without substantial attenuation. A divider that can downscale voltage magnitude without attenuating changes in the voltage being scaled preferably is used in several regulators, according to the present invention. Alternatively, a resistor-resistor divider could be used, although a DC current path would exist, and attenuation of the desired incremental signal would occur.

A Vpn regulator is provided that may be implemented similarly to the Vpp regulator but to regulate negative high voltage. A resistor-resistor divider may be used, but as noted a DC current path is presented, and undesired attenuation of the change in Vpn to be monitored will occur. A more preferred embodiment provides a capacitor-capacitor voltage divider. To compensate for signal leakage, the divider includes MOS devices coupled to dynamically refresh the capacitor potentials. The refresh circuitry provides level-shifters operable from Vdd to provide negative polarity gate-control signals. In this embodiment, the voltage controller includes a sample and hold unit such that when the voltage divider input voltage to the comparator is being reset, stability of the Vpn output voltage is maintained.

The BL regulator and the SL regulator are preferably powered from Vpp, and each adds a third differential input, differential output to the voltage comparator. The comparator compares a precise VREF reference voltage equal to the desired BL or SL voltage against the selected BL voltage or selected SL voltage, using a feedback loop. The SL decoder may be configured as a Y-decoder or as an X-decoder, depending upon the array configuration. As before, the comparator output is input to a voltage controller whose output voltage is the BL voltage or SL voltage. In the BL regulator, the voltage controller output is coupled via the data-in buffer and Y-select gate to the various BLs. In the SL regulator, the voltage controller output may be coupled via an optional SL decoder to the various SLs in the array.

Each BL and each SL terminates at the gate of an NMOS device that is identical to the terminating devices at the other BLs or the other SLs. The drain leads of the NMOS devices are coupled together and to the input of the voltage comparator, and the source leads are coupled together and to ground. Preferably the entire array is divided into several groups of SLs and BLs. However, only one selected BL and one selected SL in each group will be at high potential. Thus, only one NMOS device will be in an active state in the BL and in the SL regulator. The NMOS potential corresponding to the selected BL or selected SL is on input to the voltage comparator in the BL or SL regulator. The other input to the voltage comparator comes from the drain of an NMOS device, identical to the BL or SL terminating NMOS devices, whose source is grounded and whose gate is at a VREF precision voltage that is at the desired BL or SL potential.

The VREF potential may be varied in amplitude in ramp or stair-step fashion to vary WL and SL in ramp or stair-step fashion, for example, to accommodate an array that includes multiple level memory ("MLC") cells.

In one aspect, the present invention automatically adjusts VREF magnitude as a function of address location of selected memory cells. This feature compensates for ohmic losses such that the same BL potential or the same SL potential is delivered to selected cells, independently of their array location. Using Y-select gate signals, for example, a logic unit can OR (or otherwise signal process) combination of Y-select signals to cause a programmable resistor divider to increase voltage division, e.g., from Vpp, when the logic signals correspond to address locations associated with longer and thus higher ohmic losses. The divider automatically increases or decreases VREF, e.g., the divider output, by switching in a resistor in the divider that most closely will cause voltage division to output an appropriate magnitude of VREF for the cell location governed by the operative logic gate signals.

The present invention further provides closed-loop feedback positive and negative WL regulators that finely regulate positive Vpp' and negative Vpn potential, respectively to output potentials WL(p) and WL(n). The positive WL regulator operates from Vpp and includes a three stage differential input differential output comparator. The first comparator input is proportional to a fraction of Vpp, obtained from a series-string of resistors in an NMOS-programmable resistor divider. The second comparator input is proportional to the selected WL. Each WL terminates in the gate of an NMOS that is identical to the NMOS devices included in the resistor divider. Non-selected BLs will be at ground and only the selected BL voltage will be high, with the result that the second comparator input is automatically proportional to the selected positive WP potential. Logic signals coupled to the gates of the programmable NMOS devices in the resistor divider string can cause the first comparator input to be changed sequentially, e.g., to change WL(P) sequentially, or to hold at a given WL(P) magnitude. Programmably controlling WL(P) permits the present invention to generate precise WL voltages not merely for erase, program, repair and verify modes, but also to read MLC devices within the array.

A negative WL regulator operates from Vpn and includes three-stage differential input differential-output comparator whose first comparator input is proportional to a fraction of Vpn obtained from a series-string of resistors in an PMOS-programmable resistor divider. The second comparator input is obtained from an identical PMOS device whose gate is coupled to a dummy WL that preferably is coupled to the X-decoder associated with the array, and is substantially identical to an actual WL in the array. The comparator output is coupled to the Xdecoder whose outputs are coupled to the various WLs and to the dummy WL.

The present invention provides a WL detector that may be used to read and verify MLCs. A two-stage parallel mode comparator is used that has differential-input differential-output first stage and, to shorten read times, a plurality of separate differential input single-ended output second stages. The WL detector includes a resistor-divider string coupled between Vpp and ground, in which each voltage tap node is coupled to the gate of an NMOS device coupled as a portion of parallel inputs to the first stage first comparator input. The first stage second comparator input is coupled to a plurality of NMOS devices, each having a gate coupled to a WL, and a source coupled to ground. The various second comparator stages will sequentially change state as the WL voltage is changed, e.g., ramped-up in magnitude, as the various voltage taps sequentially reach an amplitude sufficient to turn-on the associated NMOS device.

The present invention preferably also provides an on-chip Vdd/Vpp magnitude detector whose signal outputs may be used to fine-tune voltage regulators and/or disable on-chip voltage pumps whose outputs may be unnecessary because off-chip power source(s) are present to provide pump voltages. A series-coupled chain of voltage dividing resistors is coupled between Vdd or Vpp and ground, with resistor tap node voltages being coupled to NMOS device gates. A differential two-stage comparator compares a reference voltage, e.g., VREF(P) against the various tap node voltages. A plurality of second-stage comparators sequentially change state as Vdd or Vpp exceeds a magnitude sufficient to turn-on the associated NMOS device. The various second-stage comparator outputs thus quantize magnitude of Vdd or Vpp, and can be coupled to regulators to fine-tune regulation, or can be used as logic signals to disable one or more on-chip pumps whose output voltage is unnecessary because of a sufficiently high magnitude of Vdd and/or Vpp.

Other features and advantages of the invention will appear from the following description in which the preferred embodiments have been set forth in detail, in conjunction with the accompanying drawings.

BRIEF DESCRIPTION OF THE DRAWINGS

FIGS. 7D-1, 7D-2, and 7E depict preferred implementations of low ripple voltage shifters such as used in the embodiment of FIG. 7B, according to the present invention;

DETAILED DESCRIPTION OF THE PREFERRED EMBODIMENTS

Figure 2:
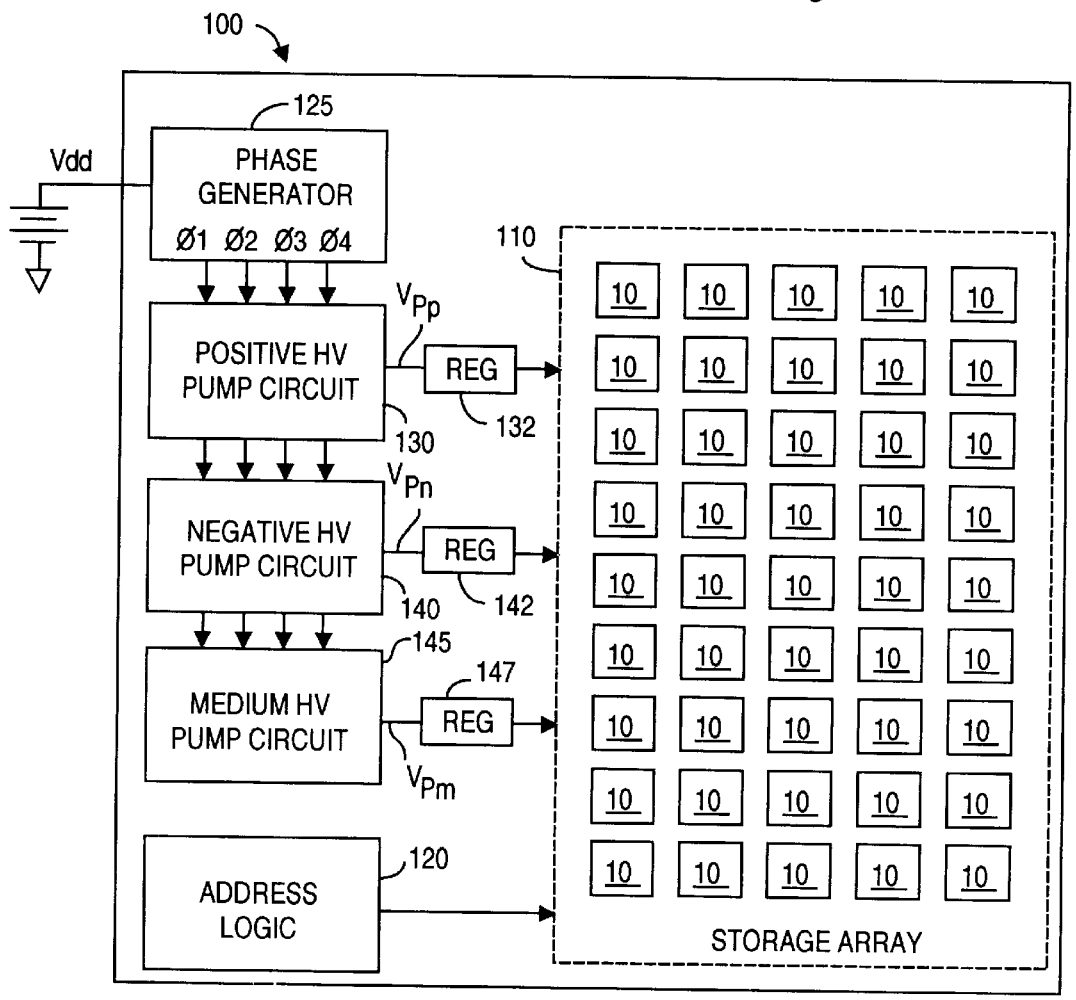
FIG. 2 depicts an IC including positive and negative high voltage pump circuits, a multi-phase generator, and an array of storage cells, according to the prior art.
Figure 3:
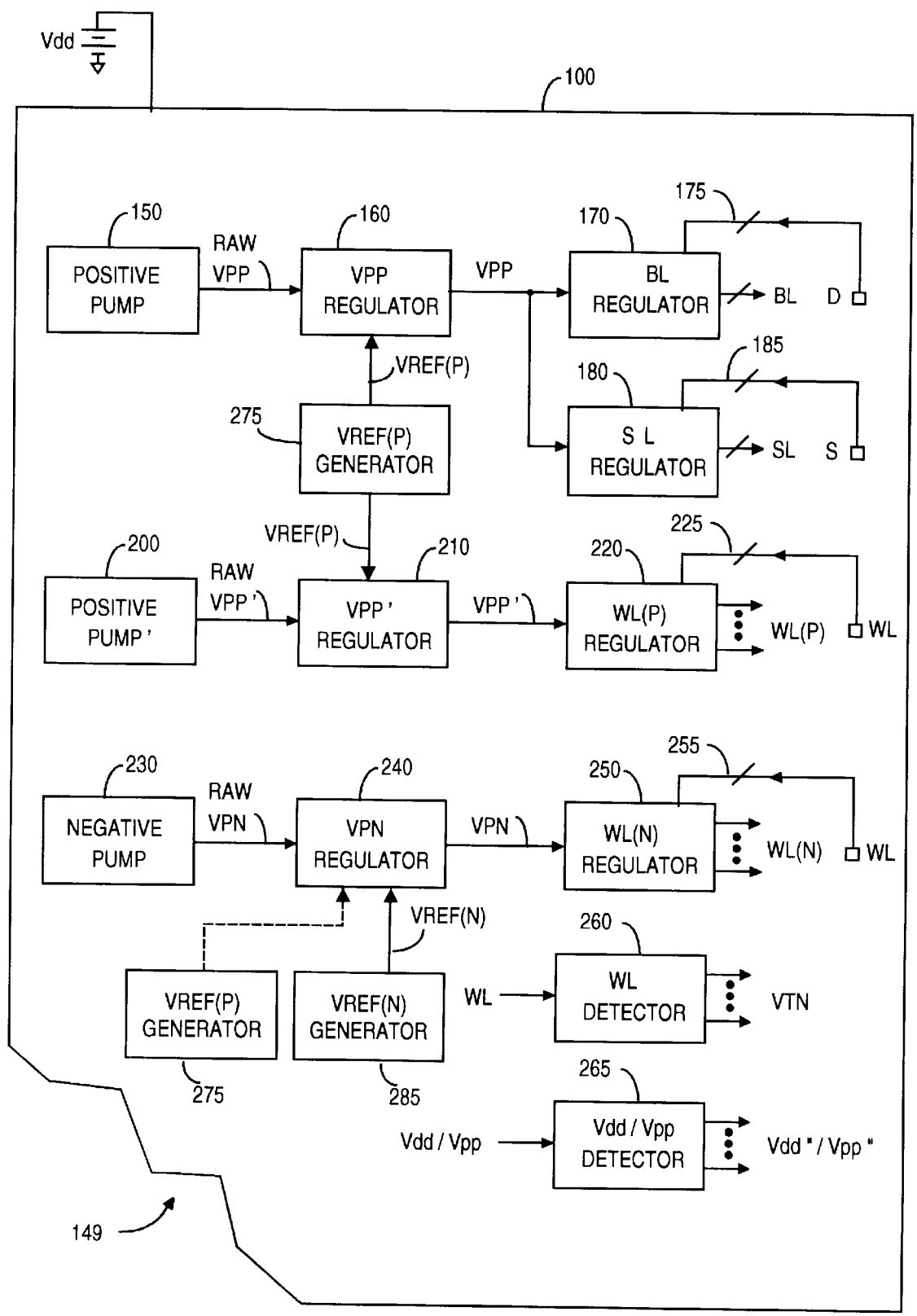
FIG. 3 is a block diagram of an on-chip voltage regulation system, according to the present invention.

FIG. 3 is a block diagram of a voltage regulation system 149 according to the present invention fabricated on an IC 100, which IC 100 preferably also includes a storage array such as 110, shown in FIG. 2. Positive voltage pumps 150, 200, and negative voltage pump 230 may be similar to pumps 130, 145, and to pump 140, respectively, as shown in FIG. 2. Alternatively, various or all of these pumps may be implemented as disclosed in applicants' earlier-referenced pending patent applications. Pumps 150, 200, 230 output an unregulated or raw voltage whose absolute magnitude is greater than the Vdd power supply that is coupled to these pumps (as well as to other circuitry on IC 100). As disclosed in applicants' earlier-referenced co-pending patent application, it is in fact possible to generate positive and negative high voltages from a single re-configurable high voltage charge pump system. In such an embodiment, pumps 200 and 230 could be combined into a single reconfigurable unit, to save space on IC 10.

Positive pump 150 provides positive medium voltage (e.g., +5 V) at high current for selected memory cell (e.g., cell 10 in FIG. 1) drain voltage (bitline or BL voltage and source voltage (sourceline or SL voltage). Positive pump 200 provides positive high voltage (e.g., +10 V) at high current for selected memory cell control gate voltage (wordline or WL voltage). Negative pump 230 outputs low current potential for the control gate voltage (or wordline voltage) of selected cells.

The raw output voltages Vpp, Vpp' and Vpn are coupled to regulators 160, 210, and 240, respectively, that provide intermediate regulation to their respective outputs Vpp (perhaps +5 VDC), Vpp' (perhaps +8 VDC) and Vpn (perhaps −8 VDC). These potentials are then finely regulated such that BL regulator 170 outputs potential Vbl (about +5 VDC for program operation), and SL regulator 180 outputs Vsl (about +5 VDC for erase operation). The positive WL regulator 220 receives as input the WL potential, and can output a target WL potential WL(P) that can have different magnitudes ranging from about 0 VDC to about +8 VDC. These different magnitude WL(P) potentials may be used for read, verify, or program operations. The negative WL regulator 250 receives as input the WL potential, and can output a target WL potential WL(N) that can have different magnitudes ranging from about 0 VDC to about −8 VDC. These different magnitude WL(N) potentials may be used in read, verify, or erase operations.

Referring still to FIG. 3, WL detector 260 receives as input the WL potential, and outputs multiple signals VTN that indicate the WL voltage, where N is an integer number. System 149 further includes a Vdd/Vpp detector unit 265. Unit 265 detects the value of the external power supply voltages and outputs signals Vdd", Vpp" that are used to automatically adjust some circuitry to minimize power supply variation effects, e.g., sense amplifiers, I/O buffers, etc.

For example, modern flash memory arrays can operate from Vdd supplies of 1.8 V or 3.3 V or 5.5 V (±10%), with Vpp having a range of perhaps 5 V to 12 V (±10%). Unit 265 outputs a plurality of signals (not power sources) proportional to changes in Vdd and/or Vpp. If unit 265 detects the presence of externally provided voltage having a sufficiently large magnitude, unit 265 can output a detection signal (e.g., signal Vpp") to disable on-chip generation of such voltage. Thus, if externally provided Vpp is present at a sufficiently large magnitude, unit 265 can output a control signal disabling on-chip generation of Vpp, thereby reducing power consumption.

Finally, system 149 preferably further includes on-chip positive voltage reference generator 275 that outputs VREF (P) for use by Vpp regulator 160, Vpp' regulator 210, and optionally by Vpn regulator 240. System 149 also preferably includes an on-chip negative voltage reference generator VREF(N) that outputs VREF(N) for use by Vpn regulator 240. (Reference voltages for other of the regulators provided by the present invention are derived from the regulated precise Vpp and Vpn voltages.) The on-chip generation of these VREF(P) and VREF(N) voltages contributes to the successful implementation of the present invention.

It is the function of bitline regulator 170 and sourceline regulator 180 to more precisely regulate Vpp, and to delivery a finely regulated potential to selected bitlines (BLs) and sourcelines (SLs) in array 110. As shown, respective feedback loops 175 and 185 provides BL regulator 170 and SL regulator 180 with a measure of the BL potential and the SL potential as the target drain (D) and source (S) nodes of cells 10 within array 110. For ease of illustration, feedback loops 175 and 185 are drawn as being single path, however as denoted by the diagonal slash, a plurality of feedback loops are in fact present. Preferably eight BLs will be sensed and regulated as a block, whereas the number of associated SLs to be sensed and regulated will depend upon the layout of IC 10. Note too in FIG. 3 that the slash symbol on the BL output of BL regulator 170 denotes that a plurality of BLs are regulated, and similarly, the slash on the SL output of SL regulator 180 denotes that a plurality of SLs are regulated.

A positive voltage wordline WL(P) regulator 220 receives Vpp' and delivers a finely regulated positive potential to selected wordlines (WL(P)). Note that a feedback loop 225 provides WL(P) regulator 220 with a measure of the positive WL potential at the target WLs within array 110. A negative WL regulator 250 receives Vpn and outputs a finely regulated negative potential to selected WLs within array 100. Note that a feedback loop 255 provides WL(N) regulator 250 with a measure of the actual negative potential seen at the target WLs. The diagonal slash shown in FIG. 3 for feedback loops 225 and 255 denotes that a plurality of such loops is present, e.g., preferably eight BLs being detected and regulated together. Finally, system 149 includes a WL detector 260 that, as will be described, can detect selected WLs using relatively few components.

By way of overview, BL connections are made to a cell's drain node using metal, since the BL may conduct up to perhaps 0.5 mA DC current. These metal traces have perhaps 1 Ω impedance, which is equivalent to an ohmic loss of only about 5 mV at 0.5 mA. In the present invention, the BLs are defined as belonging to a sub-group comprising eight BLs, only one of which BLs is selected during BL selection. Thus it is understood there will be eight BL regulators 170 per group, each of which regulators operates independently. There are a great many more SLs and in the preferred embodiment, the SLs are grouped into sub-groups, numbering perhaps eight SLs. However, SLs need carry only perhaps 10 nA/cell, which for 1,000 cells at an impedance for N+ implant (for the connections, as metal need not be used) of 100 Ω/cell is about 1 mV. It will be appreciated that BL and SL regulation can be implemented with many common features. The BLs preferably are decoded using a Y-decoder vis Y-select transistors, while the SLs may be similarly decoded by a Y-decoder (e.g., YB, YC, YD in FIG. 9), or by an X-decoder, depending upon array implementation.

The WL, terminating at the control gate of a cell, draws no current per se. The present invention regulates WL potential by regulating the gate node of any memory cell on a WL, regardless of whether the cell is at the beginning or end of the physical WL. Thus, the present invention can provide feedback from any node on the WL, any node being equivalent to actual physical nodes of selected cells on the WL. Thus, WL regulation is tantamount of regulating potential at the actual selected memory cell gate nodes. The present invention implements WL regulation using a dummy WL, substantially identical to an actual WL on the IC chip. Both positive and negative WL potentials are finely regulated, as are BL and SL potentials, in a manner equivalent to regulating potentials at the actual nodes of gate, drain, and source of selected memory cells.

As noted, Vdd/Vpp detector 265 is coupled to detect magnitudes of external power supplies, Vdd, Vpp, and outputs signals (e.g., Vdd", Vpp") proportional to such magnitudes. The output signals are used by other circuitry to help decrease system performance to variations in power supply. System 149 further includes, preferably also on IC 100, positive and negative VREF generators 275, 285, which output respective VREF(P) and VREF(N) precision voltages for use, respectively, by Vpp, Vpp' regulators 160, 210, and by Vn regulator 240 (see FIG. 3).

Figure 4A:
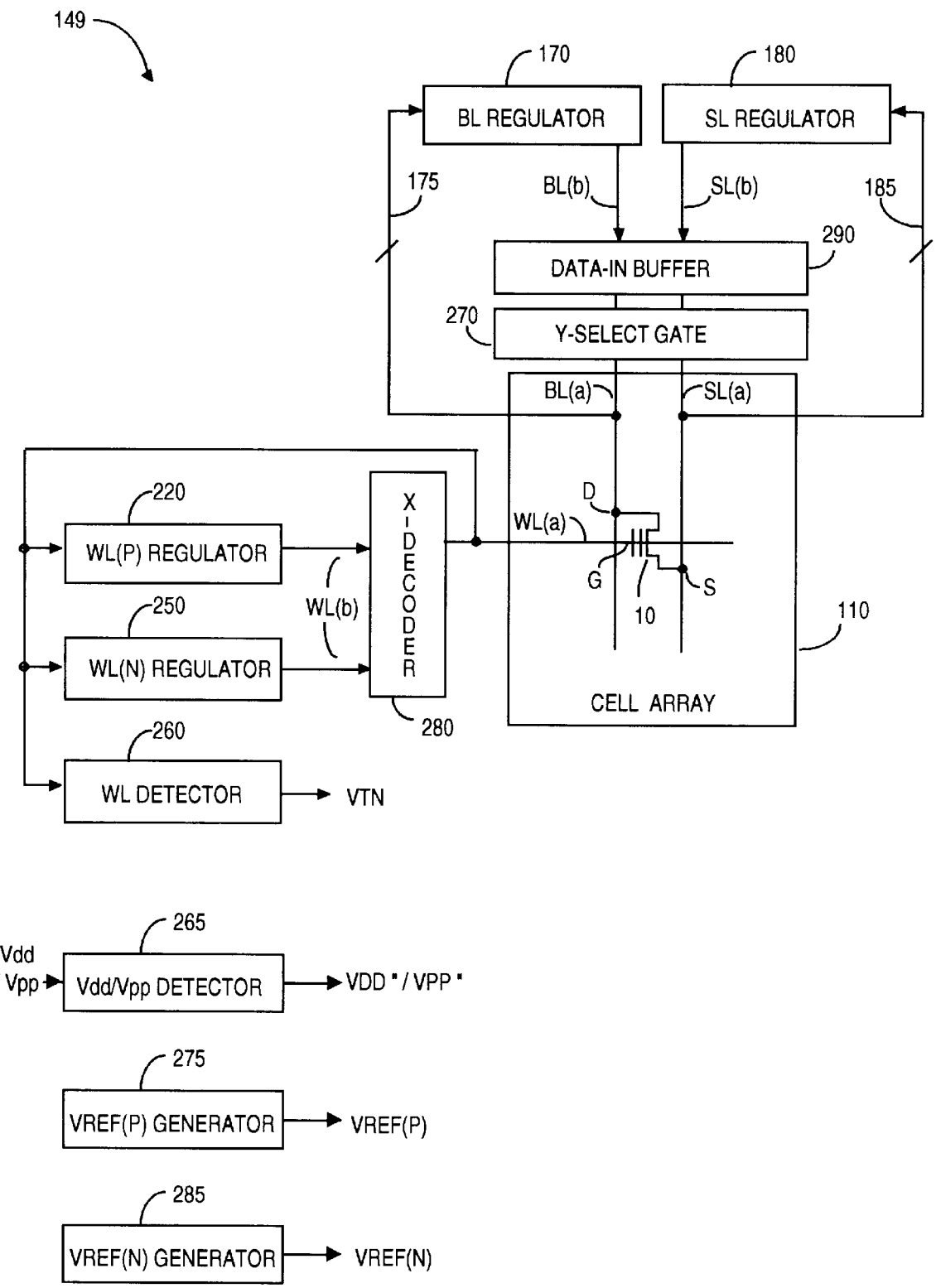
FIG. 4A is a detailed depiction of a portion of the system shown in FIG. 3, according to one embodiment of the present invention.

FIG. 4A depicts a portion of system 149 in further detail, especially with respect to the relationship between the various regulators and circuitry associated with the cell array 110. Memory array 110 includes a plurality of storage cells 10 (as indicated by array 110 in FIG. 2), each having a drain (D) coupled to a bitline such as BL(a), a source (S) coupled to a sourceline such as SL(a), and a control gate (G) coupled to a wordline such as WL(a). Those skilled in the art will appreciate that in some flash arrays, it may not be feasible to directly sense the flash memory cell source node. In such circumstances, the present invention permits detection of potentials at source, gate, and drain nodes of selected memory cells after X-decoding and Y-selection, e.g., as BL nodes, SL nodes, and WL nodes, denoted in FIG. 4 as BL(a), SL(a) and WL(a). Thus, if desired, selected nodes SL(a) may be output from the X-decoder, or from the Y-select unit.

The cell to be addressed or targeted is selected by address logic (such as address logic 120 in FIG. 2). More specifically, target selection, for example, a cell at coordinates [BL(a),SL(a),WL(a)] is made using a Y-select gate decoder 270, and X-decoder 280, which are coupled to BL(b), SL(a) and WL(a) respectively. The memory cell nodes at which it is critical to deliver regulated voltage are BL(a) or the drain (D) nodes, SL(a) or the source (S) nodes, and WL(a) or the gate (G) nodes of selected cells. (Data-in buffer 290 function in a normal manner to buffer data to or from target memory cells.)

Figure 4B:
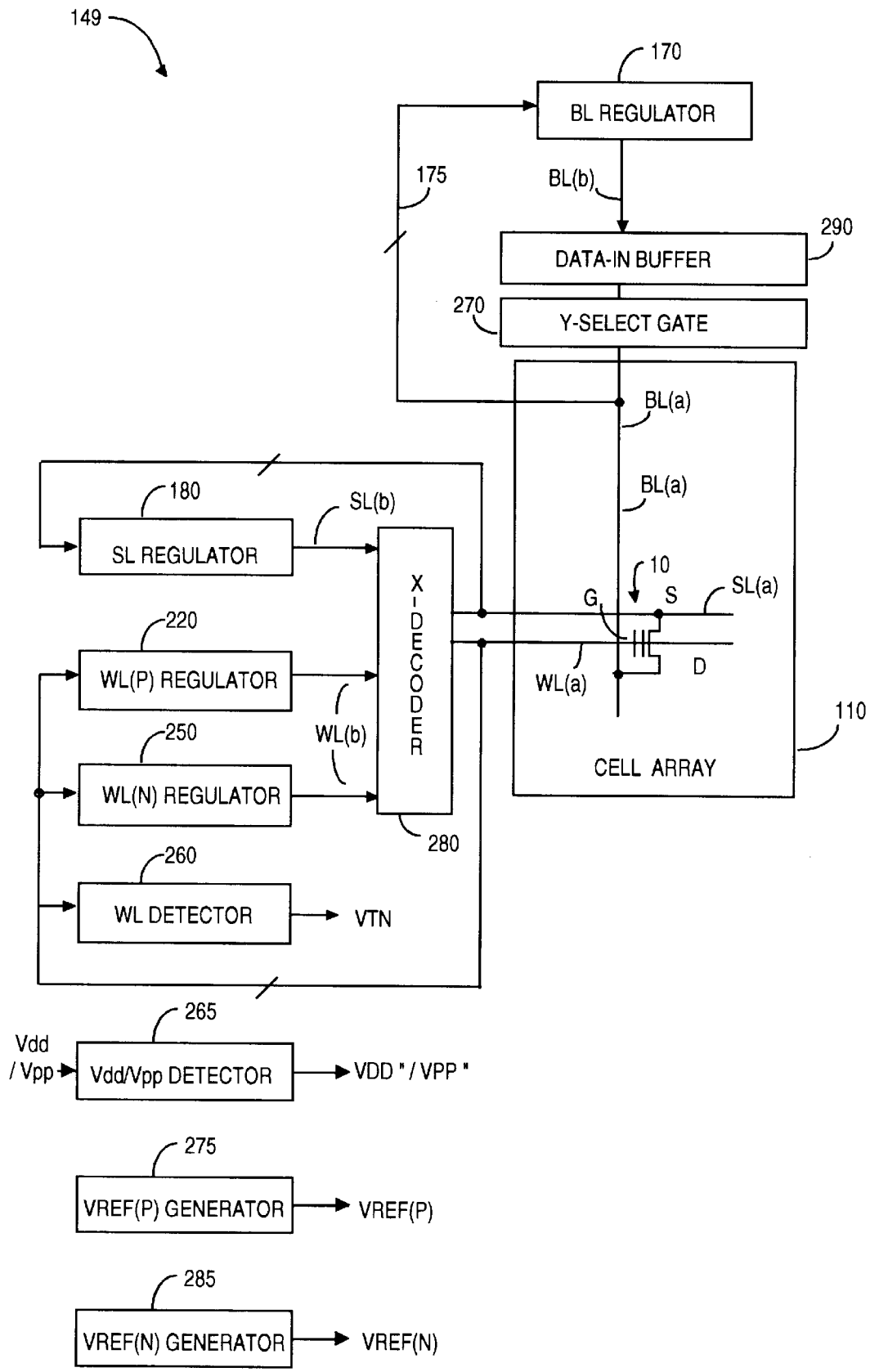
FIG. 4B is a detailed depiction of a portion of the system shown in FIG. 3, according to a second embodiment of the present invention.

In the somewhat similar alternative embodiment shown in FIG. 4B, SL(a) is controlled by X-decoder 280 similarly to a WL. By contrast, in the configuration of FIG. 4A, SL(a) is selected by Y-select gate 270 similarly to selection of BL(a).

As noted, in prior art voltage regulation systems, what is sensed and regulated is the potential delivered at BL(b), SL(b) and WL(b). This approach seems to have been adopted in part because of the difficulty in directly sensing the potentials at the desired target nodes BL(a), SL(a), SL(a). Unfortunately, no matter how finely the potential might be regulated at those locations, fabrication and system variations including environmental variations can result in poorly regulated potentials where the potentials are needed, namely at nodes BL(a), SL(a), and WL(a).

By contrast to such prior art voltage regulation schemes, the present application senses potential at the target nodes BL(a), SL(a), and WL(a). The actual node potentials are then fedback (for example via feedback paths 175, 185, 225, 255) to the relevant voltage regulator. The relevant voltage regulator can then increase or decrease its output potential as needed to ensure finely regulated potential delivered to the target nodes BL(a), SL(a), and WL(a). Those skilled in the art of feedback loops will appreciate that variations in potential at the target nodes (perhaps due to fabrication and/or system and/or environmental changes) will nonetheless be compensated for by the present invention. The resultant finely controlled target node potentials ensure more reliable operation of cells within array 110.

Figure 5A:
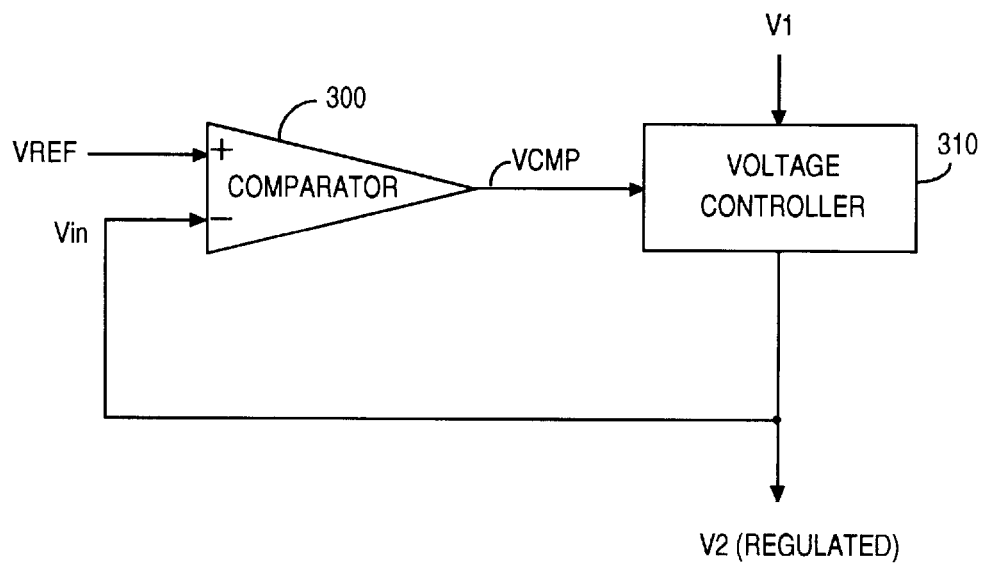
FIGS. 5A and 5B show voltage regulator configurations with and without voltage division, as used to implement portions of the present invention.

FIG. 5A depicts the functioning of a first voltage regulator embodiment, useable in the present invention. A voltage comparator unit 300 receives as a first input, typically to its non-inverting input, a source of reference voltage (VREF) from a precision voltage source (not shown) that preferably is also implemented on the same IC 100. Comparator 300 compares VREF to whatever potential (Vin) is present at the inverting input, and multiplies the error difference by the gain of the comparator. The comparator output signal Vcmp is then input to a voltage controller unit 310 that operates from a higher (and not necessarily well regulated) source of operating potential V1. The output from voltage controller 310 is a regulated potential V2.

Figure 5B:
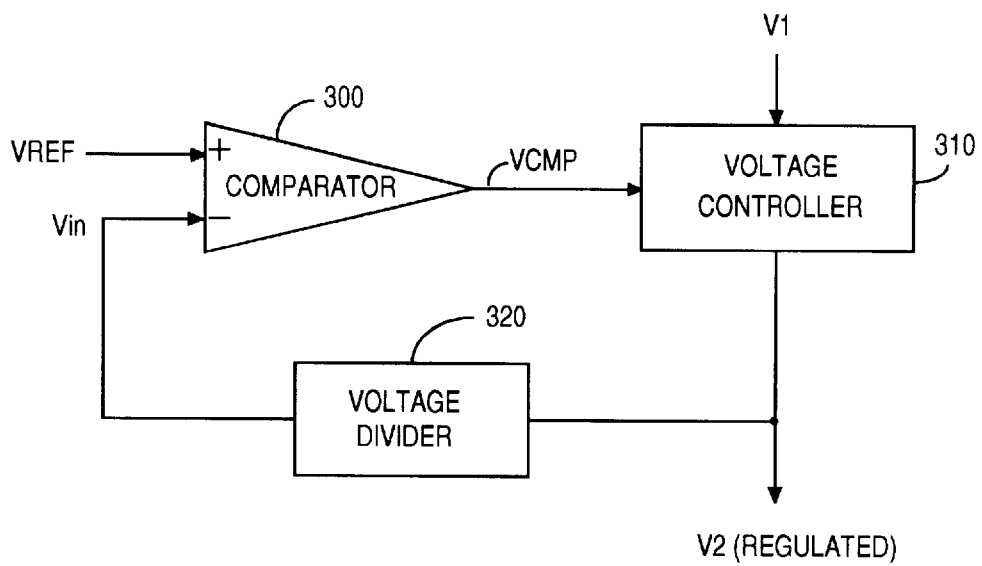

A commonly used circuit for generating VREF is a bandgap voltage generator. However, such generators can only output approximately 1.2 VDC=VREF. Thus, the embodiment of FIG. 5B is used, wherein a voltage divider 320 is placed in the feedback loop of comparator 300. For example, if divider 320 attenuates V2 by 4:1, then when Vin≈1.2 VDC, V2 will be a regulated 4.8 VDC.

Figure 6A:
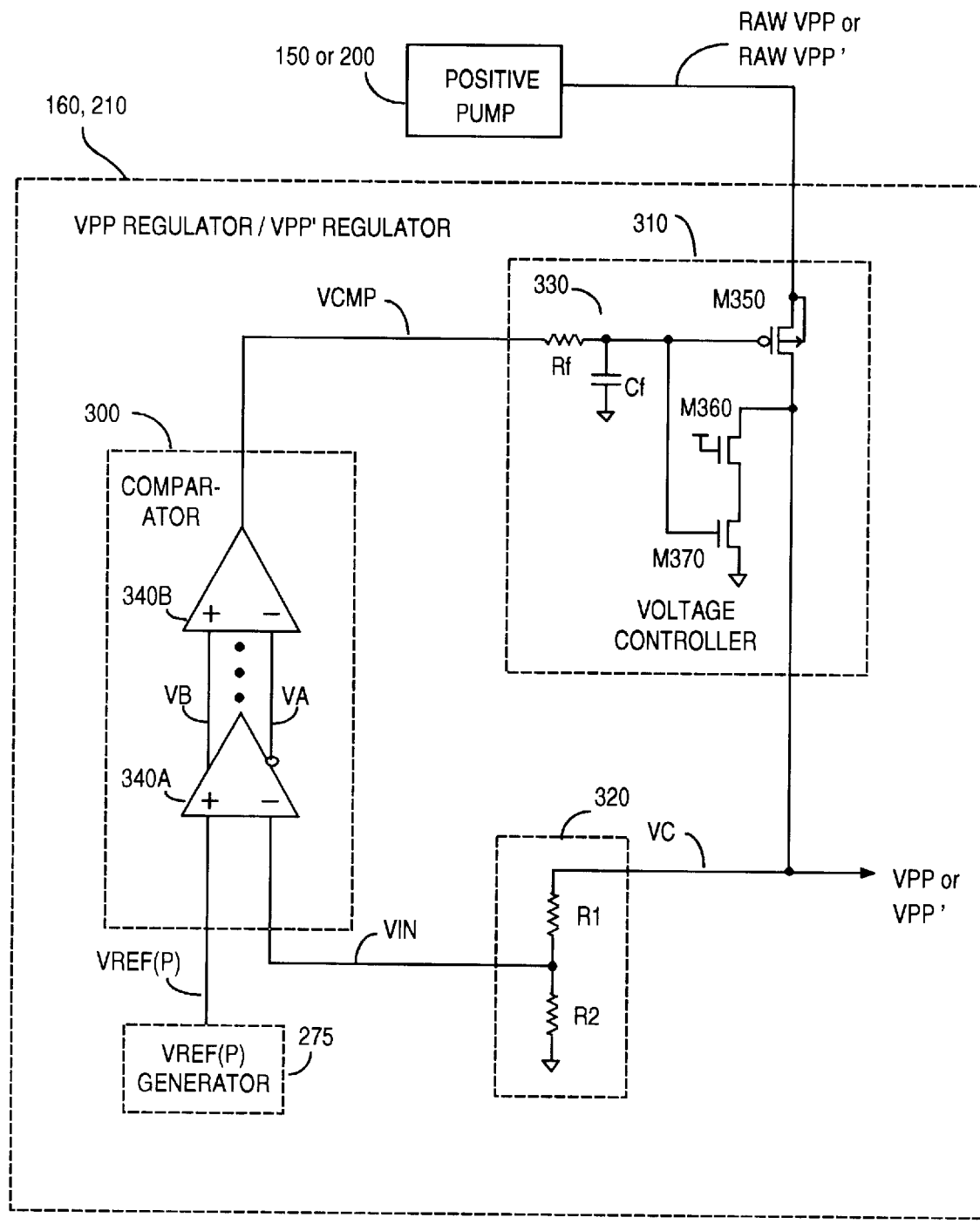
FIG. 6A is a detailed block diagram showing a first embodiment of a Vpp and/or Vpp' voltage regulator, according to the present invention.
Figure 6B:
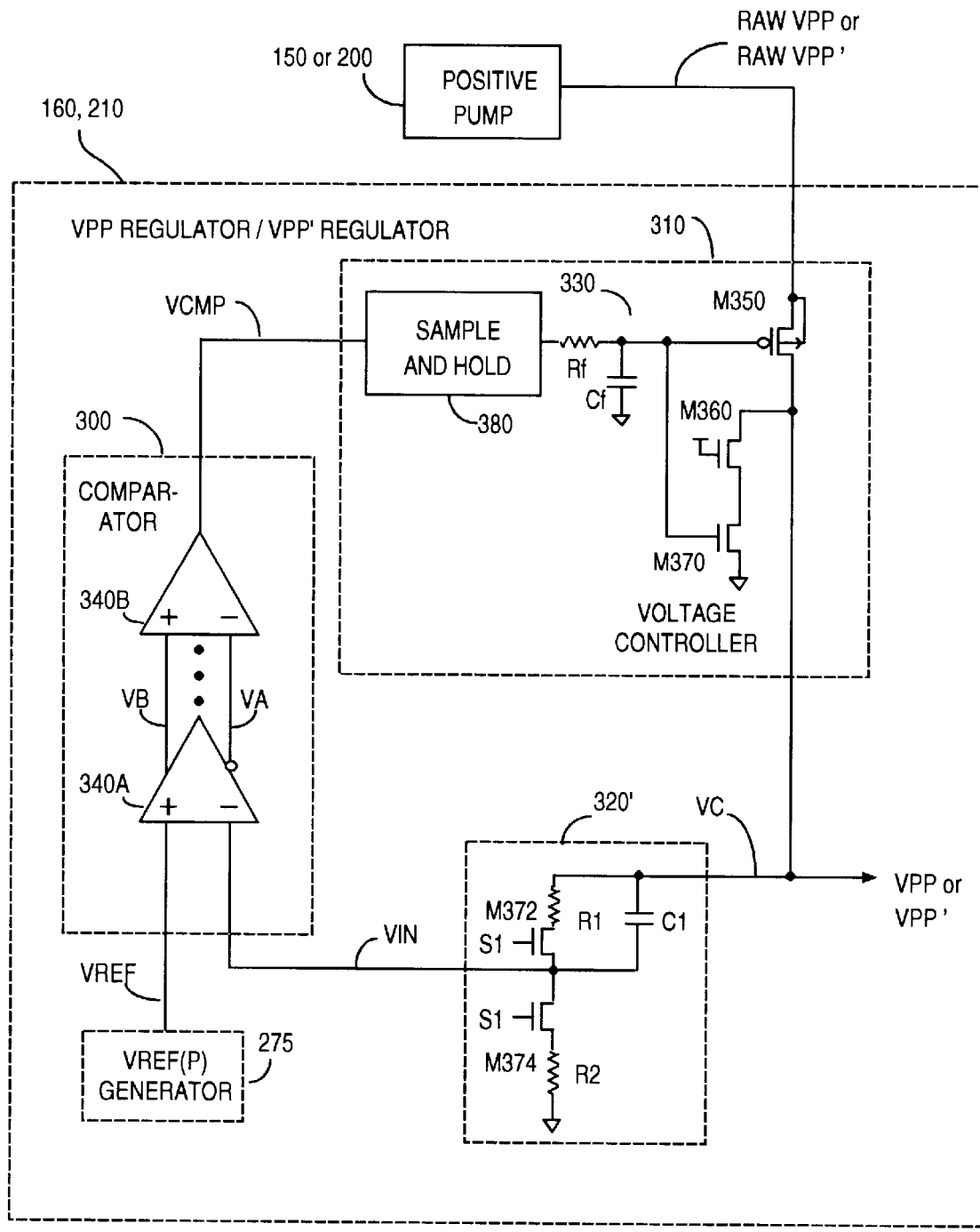
FIG. 6B is a detailed block diagram showing a second embodiment of a Vpp and/or Vpp' voltage regulator, according to the present invention.
Figure 7A:
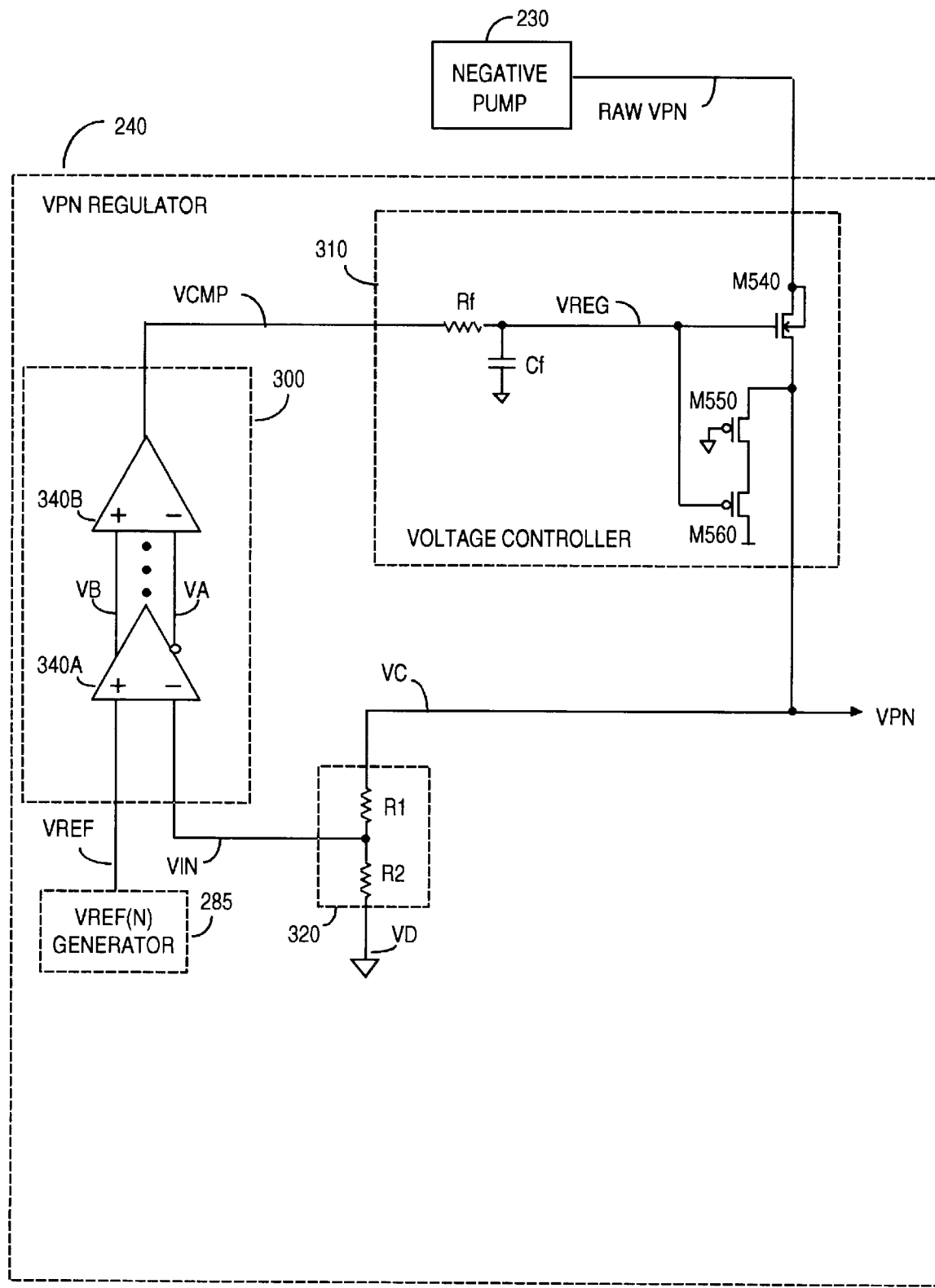
FIG. 7A is a detailed block diagram showing a first embodiment of a Vpn voltage regulator, according to the present invention.
Figure 7B:
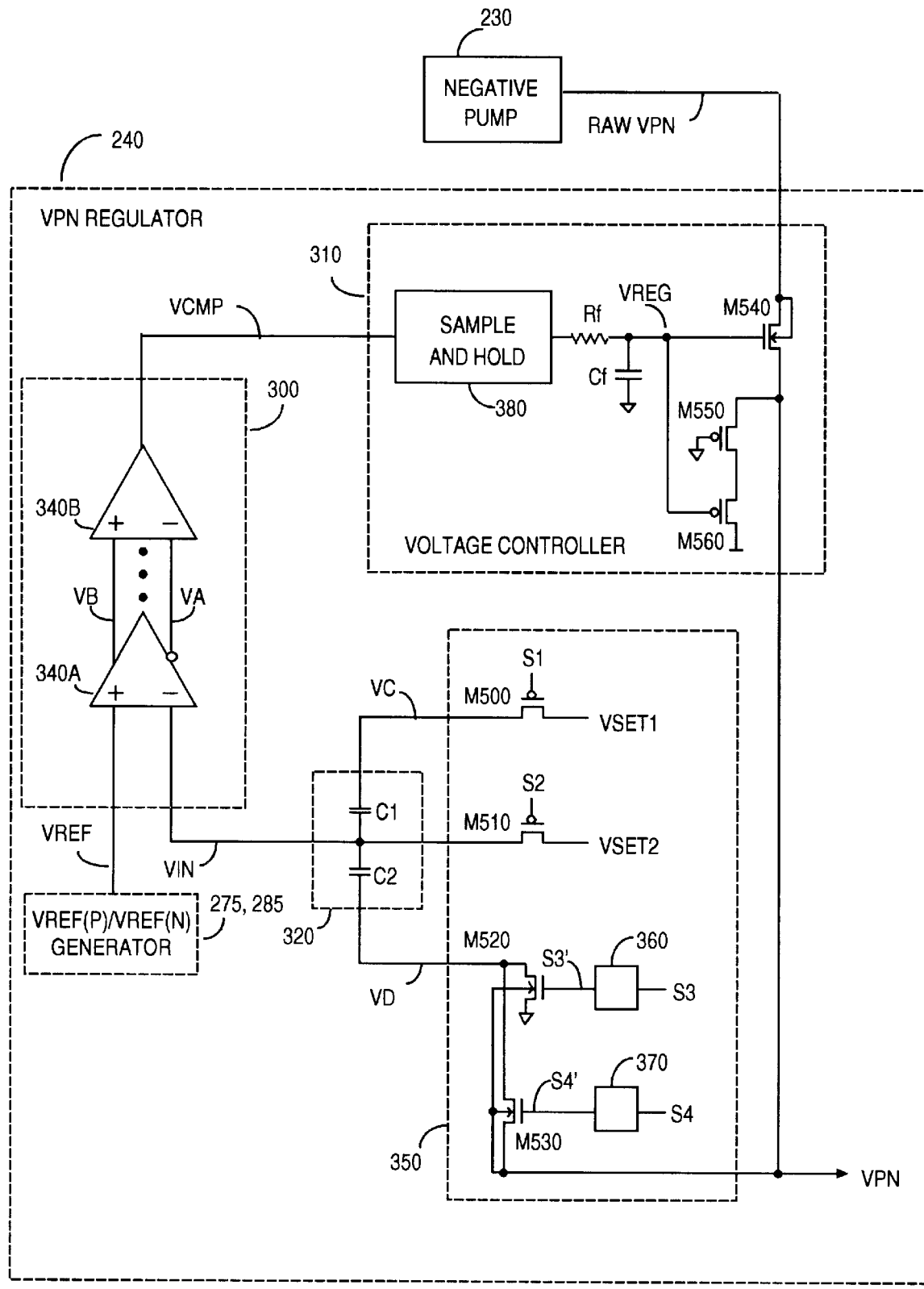
FIG. 7B is a detailed block diagram showing a second embodiment of a Vpn voltage regulator, according to the present invention.

But the inclusion of voltage divider 320, especially a resistor divider, can sometimes increase the difficulty of circuit implementation, and of measurement accuracy, as will be appreciated further herein with respect to the embodiments of FIGS. 6B and 7B. For example, resistive voltage dividers dissipate DC current, and attenuate error component present on the regulated voltage that is sensed. As a consequence, it is desired that if at all possible, voltage dividers 320, especially resistive voltage dividers, not be present, or that the number of voltage regulators requiring voltage dividers be reduced. Table 3 summarizes a preferred implementation system according to the present invention, in which a relatively few voltage regulators require inclusion of a voltage divider.

TABLE 3

| REGULATOR | VOLTAGE DIVIDER | | VREF |
|---|---|---|---|
| | yes | no | |
| Vpp,Vpp' | x | | 1.2VDC |
| Vpn | x | | 1.2VDC |
| BL | | x | desired voltage |
| SXL | | x | desired voltage |
| WL(P) | | x | desired voltage |
| WL(N) | | x | desired voltage |

In Table 3, regulators for which voltage divider 320 is absent can derive the desired VREF voltage by dividing-down Vpp, or Vpp', or Vpn, as the case may be. As described herein, voltage division may be implemented as resistor-resistor (see FIGS. 6A, 7A), capacitor-capacitor (FIG. 7B), or as a combination of resistive-divider and coupling capacitor (FIG. 6B).

Figure 5C:
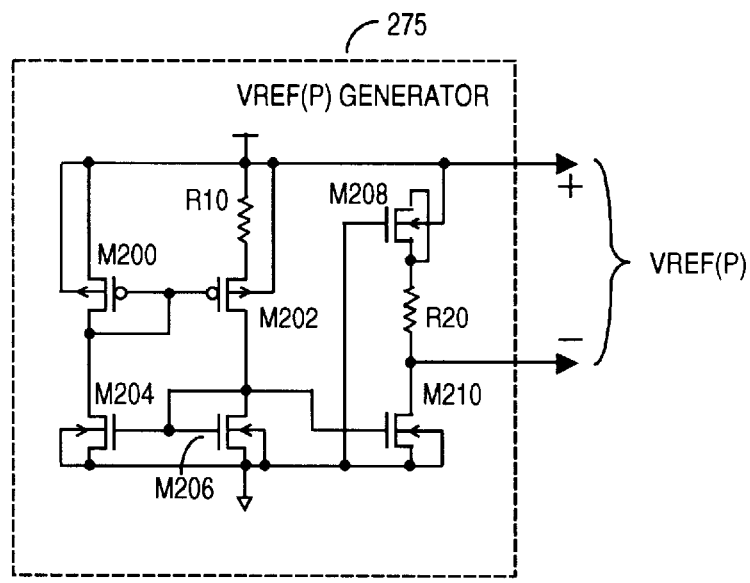
FIGS. 5C and 5D respectively are preferred embodiments of a VREF(P) and a VREF(N) voltage reference generator, such as may be used with various voltage regulators, according to the present invention.
Figure 5D:
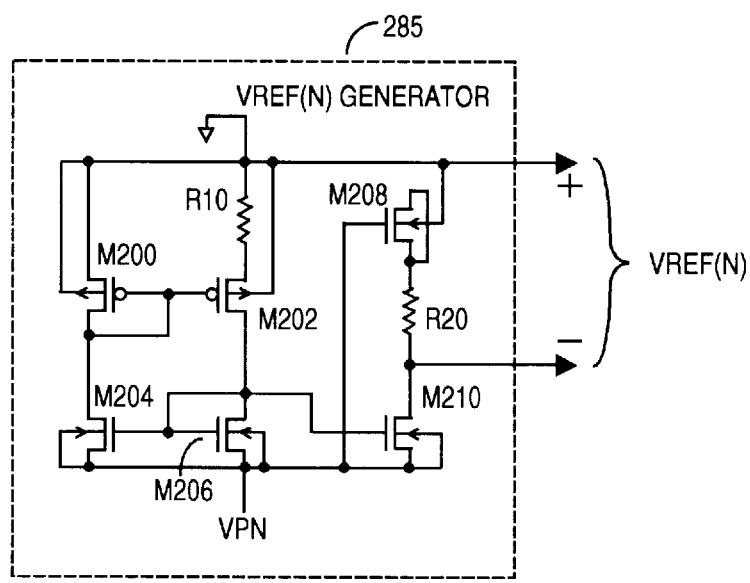

As noted in FIGS. 5A and 5B, a regulated source of reference potential VREF must be made available as an input to comparator 300, for comparison use in determining whether Vcmp should be changed to modify the regulated output voltage. FIGS. 5C and 5D respectively depict preferred embodiments of a VREF(P) and a VREF(N) precision voltage generator, which generators preferably are implemented on IC chip 100.

In FIG. 5C, VREF(P) generator 275 preferably comprises substantially identical PMOS devices M200, M202, and NMOS devices M204, M205, M208, M210. Devices M200–M202 and devices M204–M206 are current mirrors that establish a precision Vgs potential into device M210. Scaling resistors R10, R20 can produce a precision amount of current flow through R20 such that VREF(P) can be precisely controlled relative to ground. Generator 275 operates similarly to a typical bipolar device bandgap reference generator. However, to promote BICMOS fabrication, NMOS device 208 is employed instead of an NPN bipolar transistor. The VREF(P) output is taken differentially, as shown in FIG. 5C, and will be about +1.2 V, independent of power supply and ambient temperature.

Conventionally, bandgap generators only output a positive VREF. However, the present invention requires a precise negative reference voltage, for example in generating negative high potentials used in erasing flash memories. FIG. 5D is a schematic of a preferred embodiment for a VREF(N) generator 285. Operation of VREF(N) generator 285 is somewhat similar to that of VREF(P) generator 275, except that the upper power supply is ground rather than Vdd, and the lower power supply is Vpn rather than ground. Vpn may be any voltage more negative than −1.2 V, and may be taken from a negative pump voltage generator, e.g., from circuit 140 in FIG. 2, or circuit 230 in FIG. 3.

FIGS. 5E, 5F, 5G, and 5H depict preferred embodiments of a differential voltage comparator 300, such is as used in various voltage regulators, according to the present invention. Comparator 300 preferably includes at least two (and more if necessary) comparator stages, here shown as input stage 340A and final or output stage 340B. Each stage has differential inputs and all but the last stage have different outputs, in which the last stage may also have differential output, although single-ended output will be used. The differential output of the first stage goes to the differential input of the second stage, and so on.

Comparator 300 or a modification thereof may be use in regulating precise voltages, according to the present invention. In each application, the gain of comparator 300 is very high, and the first stage will receive high voltage input directly. In WL, Bl, and SL regulators, and in a WL detector and Vdd/Vpp detector, the first age has multiple programmable reference voltage inputs. Alternatively, in some WL, BL, and SL regulators, the first stage will have multiple input MOS devices to receive, potentially, multiple inputs.

The use of such comparator configurations substantially eliminates errors due to variations in fabrication process used to implement the comparator, variations in operating potential, ambient temperature, etc. Advantageously, comparator 300 may be fabricated quite compactly so as to fit within the pitch of BLs or WLs.

Conventional comparator design has dictated biasing all comparator devices in saturation mode to ensure high gain, even when operating from Vdd voltage levels. Indeed, a sufficiently high voltage gain can result in a substantially digital comparator output signal, e.g., low or high, even near the comparator trip point. By contrast, in the present invention, the first differential input, differential output comparator stage is biased to operate at low gain. Indeed, the output signals from the first stage appear more analog than digital when observed. However, even though gain is not optimized, the differential outputs from the first stage track exceedingly well the differential inputs. Stated differently, when the differential input voltages are equal to each other, the differential output voltages will equal each other. The differential inputs are high (e.g., in the volt range) signals, but the differential outputs may be at the Vdd voltage level. Thus, feeding differential output signals from the first stage to differential input signals of the next stage ensures reliable high gain performance. Thus, a two-stage comparator will generally suffice in the present application, but additional stages may be added as required.

Figure 5E:
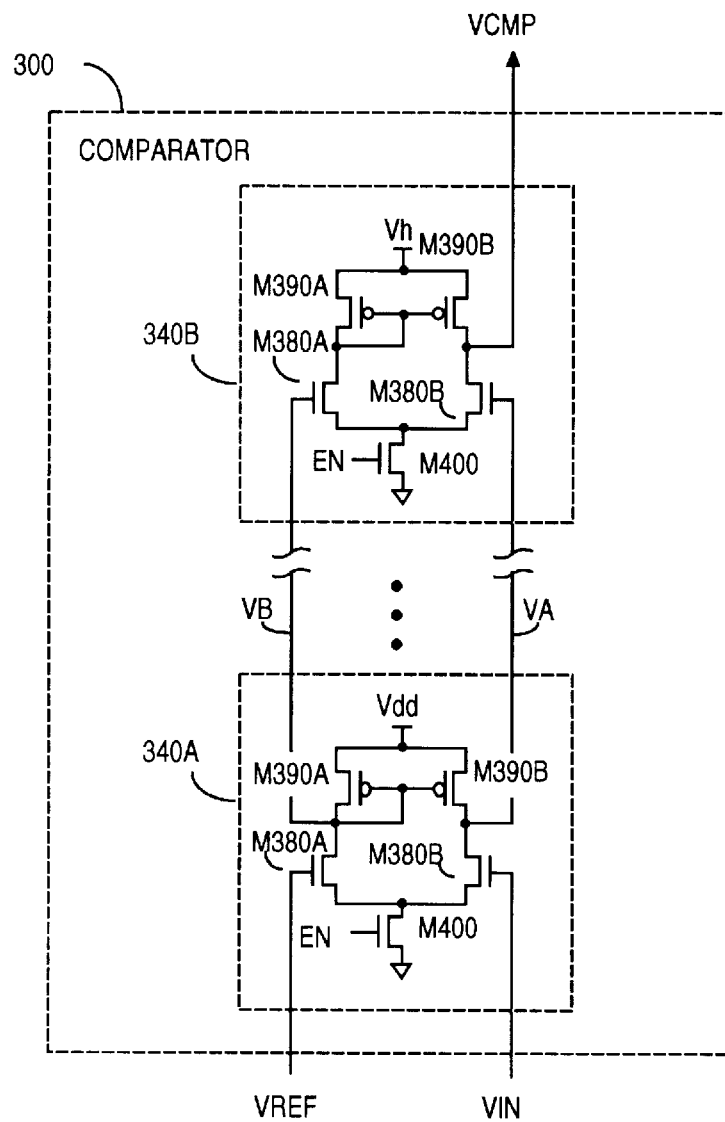
FIGS. 5E, 5F, 5G, and 5H are embodiments of a multi-stage differential input, differential output voltage comparator, such as may be used with various voltage regulators, according to the present invention.

Thus, comparator 300 preferably comprises a pair of comparator stages 340A, 340B, in which the inverted output Va of comparator stage 340A is coupled to the inverting input of second comparator stage 340B. The non-inverted output Vb from stage 340A is input to the non-inverting input of stage 340B. Comparator stages 340A and 340B may be identical. In FIG. 5E, for example, comparator stage 340A includes preferably identical NMOS devices M380A and M380B whose inputs are coupled to receive VREF and Vin respectively. A gating NMOS transistor M400 grounds or allows to float the source-coupled leads of M380A, M380 in response to an enabling EN signal. Stage 340A further includes a diode-coupled PMOS M390A and a matching PMOS M390B. The preferred configuration is such that current mirroring and voltage tracking occur within the various MOS devices. The first stage may be operated from Vdd, and the second stage from a different potential, e.g., voltage Vh.

As noted, the first stage 340A essentially scales-down the voltage level of the differential input signals without altering their relationship. The following stage(s) then performs a high gain comparator on the differential output signals from the first stage. This configuration has excellent performance even in the presence of large scale variation in power supply, fabrication process, ambient temperature, etc., primarily because the tracking properties of first stage cancels such variations. This is in contrast to conventional single-output comparators whose performance is highly subject to variations in power supply, fabrication process, temperature, etc. Thus, outputs Va and Vb from stage 340A track as noted. When comparator 300 is used with associated voltage regulators 160, 210, such regulators can maintain a very precisely regulated output voltage Vpp or Vpp'.

The output Vcmp from comparator unit 300 is pulled high or low to alter current flowing through PMOS device M350, M360, M370 to dynamically maintain Vin≈VREF. As a result, regulator output voltage Vpp or Vpp' is tightly regulated to the desired voltage magnitude. It will be appreciated that performance of comparator 300 contributes substantially to the precision of the overall voltage regulation provided by regulator 160 or regulator 210.

The down-scaling function of the first comparator stage might be replaced with a divider circuit. However, the extremely large resistor impedances need to avoid loading down a WL or WL would effectively such a technique for and WL voltage regulators. Further, the IC chip area needed to accommodate such large resistors in a divider would not fit within a BL or WL pitch. Further, in a WL or WL decoder application that selected the regulator BL or WL to be coupled to the comparator, an error voltage drop would be created by the decoding devices themselves.

Figure 5F:
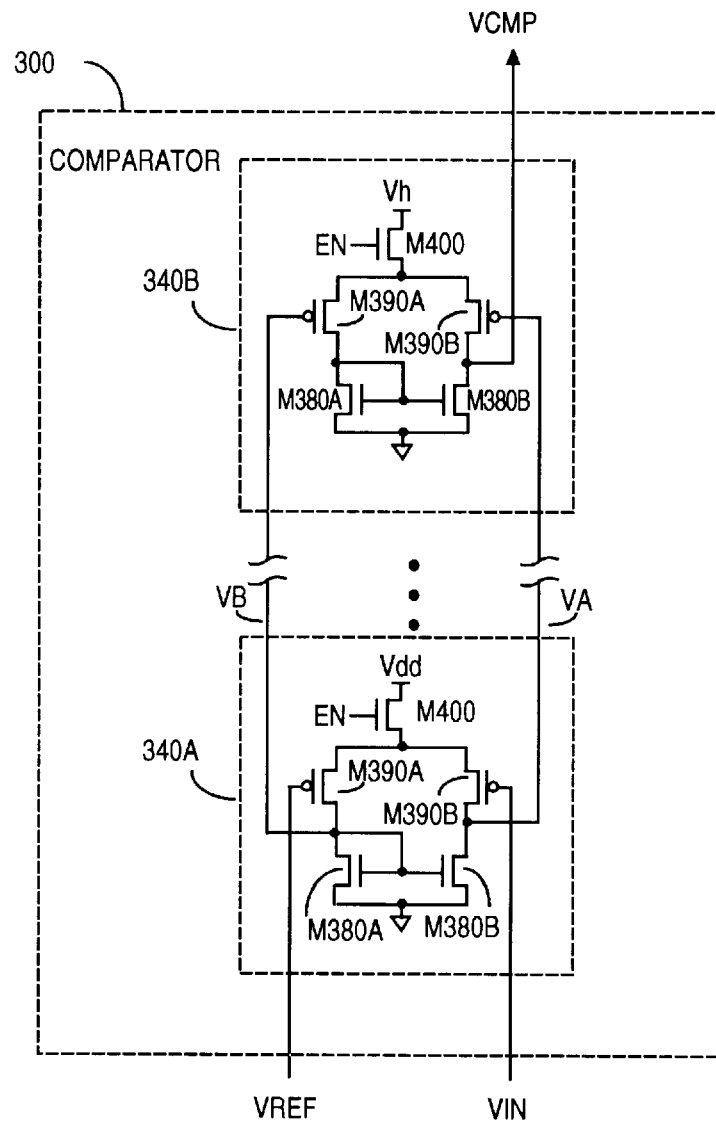

The comparator 300 shown in FIG. 5F is similar in operation to what has been described with respect to the embodiment of FIG. 5E. Although only two stages 340A, 340B are shown, additional stage may be used, in which the various stages are preferably identical, and symmetric in their functioning. In FIG. 5F, the VREF and Vin inputs are presented to the gates of PMOS devices M390A, M390B, whose Va, Vb dual outputs are coupled to the gates of similar PMOS devices in stage 340B.

Figure 5G:
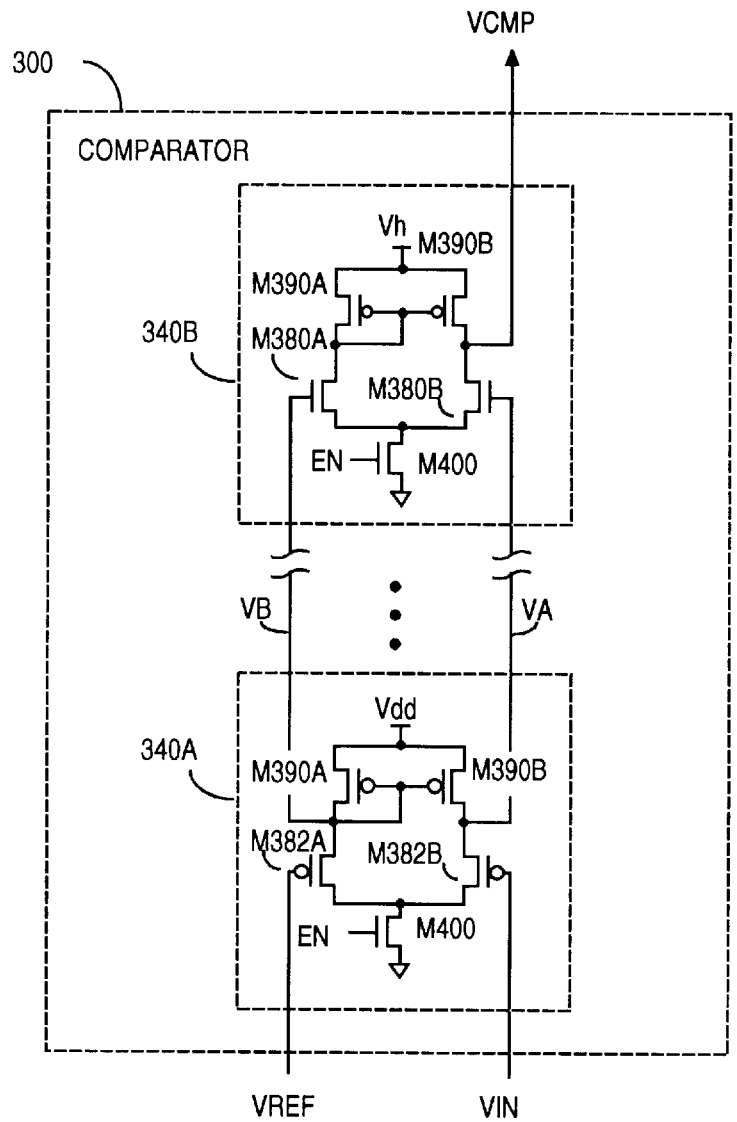
Figure 5H:
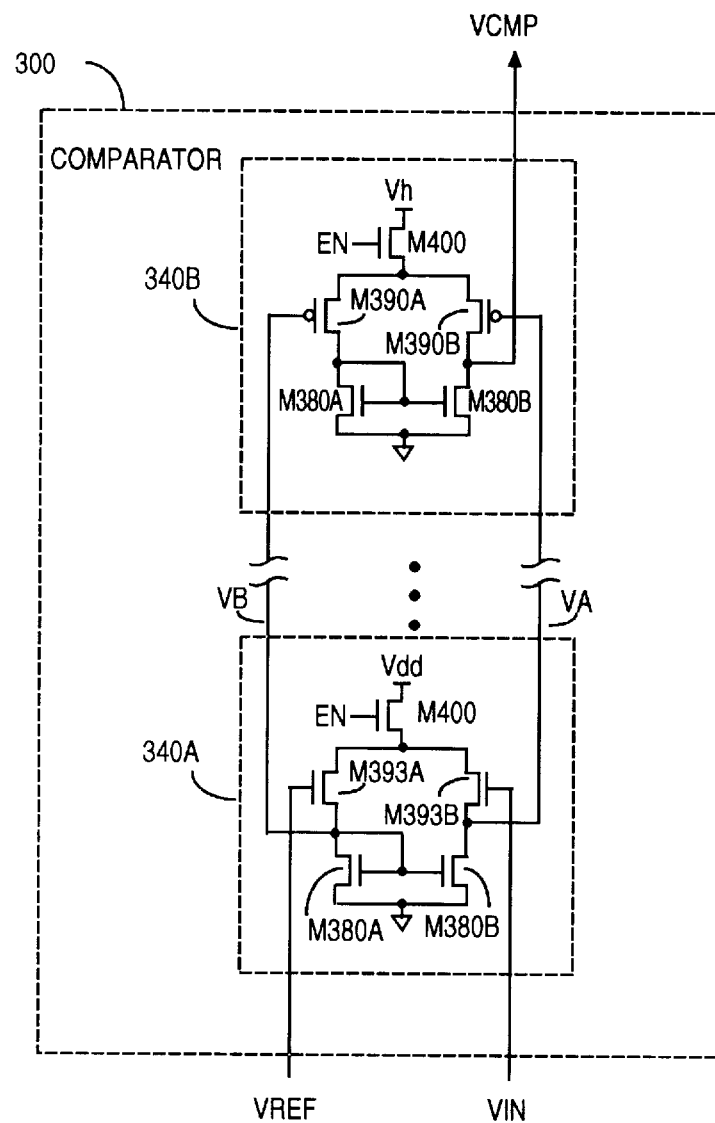

Comparator 300 in FIG. 5G is similar to that shown in FIG. 5E. However NMOS devices M380A, M380B in the input stage are changed to PMOS devices M382A, M382B. similarly, comparator 300 in FIG. 5H is similar to that of FIG. 5F, except that in the input stage, PMOS devices M390A, M390B are replaced by NMOS devices M393A, M393B.

In summary, there are many advantages to the user of applicants' multi-stage differential comparator 300, which preferably has at least two stages. A more conventional single-ended comparator can maintain a comparator output voltage precise to within perhaps 5 mV. But performance of such single-ended comparators is degraded by variations in temperature, process, power supply etc., to an extent unacceptable to the present invention. The error-canceling advantages provided by applicants' two-stage differential comparator 300 permit comparator 300 to operate well, even if powered by raw Vcc rather than by Vpp. Operation from Vcc would of course conserve operating power during regulation.

Turning now to FIG. 6A, a detailed block diagram for a first implementation of Vpp voltage regulator 160 and/or Vpp' voltage regulator 210 (see FIG. 3) is presented. As noted from FIG. 3, these regulators receive raw Vpp or raw Vpp' potential, respectively, and output Vpp and Vpp' voltages. As was shown in Table 3, Vpp regulator 160 and Vpp' regulator 210 each are implemented with the voltage divider configuration shown in FIG. 5B. Accordingly, the embodiment of FIG. 6A includes a comparator 300, a voltage controller 310 (whose operating input potential V1 is now raw Vpp or raw Vpp'), and a resistive voltage divider 320, and a resistive voltage divider 320. In the embodiment of FIG. 6B, a switched-resistor divider 320' includes a coupling capacitor C1, and operates to couple 100% (e.g., not a fraction) of the VC node potential to Vin. To help stabilize operation of regulator 160 and/or 210, voltage controller 310 includes an Rf-Cf low pass filter 330.

Voltage divider 320 scales down Vpp or Vpp' (or simply, potential Vc) to Vin according to the ratio:

$$Vin = Vpp \cdot \frac{R2}{R1 + R2}$$

Because of the voltage scaling offered by divider 320, VREF may be a precise 1.2 VDC, as output by an on-chip bandgap voltage generator, or on on-chip VREF(P) generator 275 (see FIG. 5C). The scaled potential Vin is coupled to the inverting input of comparator 300 and compared in magnitude to VREF(P), provided by generator 275. Comparator 300 outputs an error voltage Vcmp, proportional to the discrepancy between Vin and VREF(P). For example, if VREF>Vin, Vcmp will decrease. Voltage controller 320 filters Vcmp via low-pass filter 330 comprising Rf, Cf, and Vpp or Vpp' will increase in magnitude (in this example). The increase Vc signal is resistor-scaled by divider 320, a comparison against VREF(P) is again made, and the iterative cycle continues. As noted, FIG. 6A shows a resistor-resistor divider 320 comprising resistors R1 and R2, configuration that will voltage-divide the magnitude of Vpp or Vpp' but will also attenuate the change in magnitude. By contrast, a switched resistor divider with capacitor coupling unit 320' is shown in FIG. 6B.

It will be appreciated that a resistor-resistor divider 320 disadvantageously can conduct DC current, and will disadvantageously scale-down any error components in Vpp or Vpp'. Ideally, a divider 320 would scale down the magnitude of Vpp, Vpp' to about 1.2 V (e.g., to a magnitude commensurate with VREF) but would not scale down deviations in Vpp, Vpp'.

Accordingly, FIG. 6B depicts a slightly different positive Vpp or Vpp' voltage regulator 160, 210, in which a resistor voltage divider, denoted 320', is sampled. Because sampling occurs, a sample and hold unit 380 is included to ensure a stable voltage controller 310 output signal, despite the sampling process. Sample and hold unit 380 retains and provides a stable value of VCMP as input to RC-lowpass filter.

It will be appreciated that Rf-Cf lowpass filter 330 and sample and hold unit 380 could be combined. That is, Rf could be replaced by the channel impedance of PMOS-NMOS pair M650, M660 (see FIG. 7F) while the filter capacitor Cf could be replaced by the sampling capacitor.

In FIG. 6B, R1 is parallel-coupled to coupling capacitor C1, and NMOS devices M372, M374 are coupled in series with R1 and R2, and are gated by switching signals S1. The advantage of divider 320' in FIG. 6B over divider 320 in FIG. 6A is that the former divider both attenuated Vpp, by also the change in Vpp, the attenuation being resistively determined by the ratio R2/(R1+R2). As noted, only the magnitude of Vpp requires down-scaling, but any changes in Vpp, should not be attenuated. Such a result could be achieved, for example, by series-coupling an on-chip zener diode with Vpp in lieu of a resistive divider. Further, divider 320' advantageously conducts zero DC current. Again, it is understood that comparator 300 preferably includes at least two stages.

In FIG. 6B, divider 320' scales Vpp to a level commensurate with VREF(P), without attenuating changes in Vpp, thus enhancing overall effective gain of the voltage regulator. Further, this is achieved without conducting DC current. For example, when S1 is low, M372 and M374 are off, R1 and R2 float, and essentially nearly all change in Vpp (or Vpp') AC-coupled through C1 into the Vin inverting input of comparator stage 340A.

However, like any capacitor C1 will gradually lose the voltage or stored charge it sees due to junction and other leakages. Thus, S1 periodically pulses high, turning-on M372 and M374 and thus resistor-attenuating Vin, to refresh Vin. Because Vin preferably is approximately VREF(P), perhaps 1.2 V from a bandgap circuit or other VREF(P) generator, no level shifting is required for the S1 signals. The S1 signals may be generated on-chip using conventional logic circuit techniques.

Figure 6C:
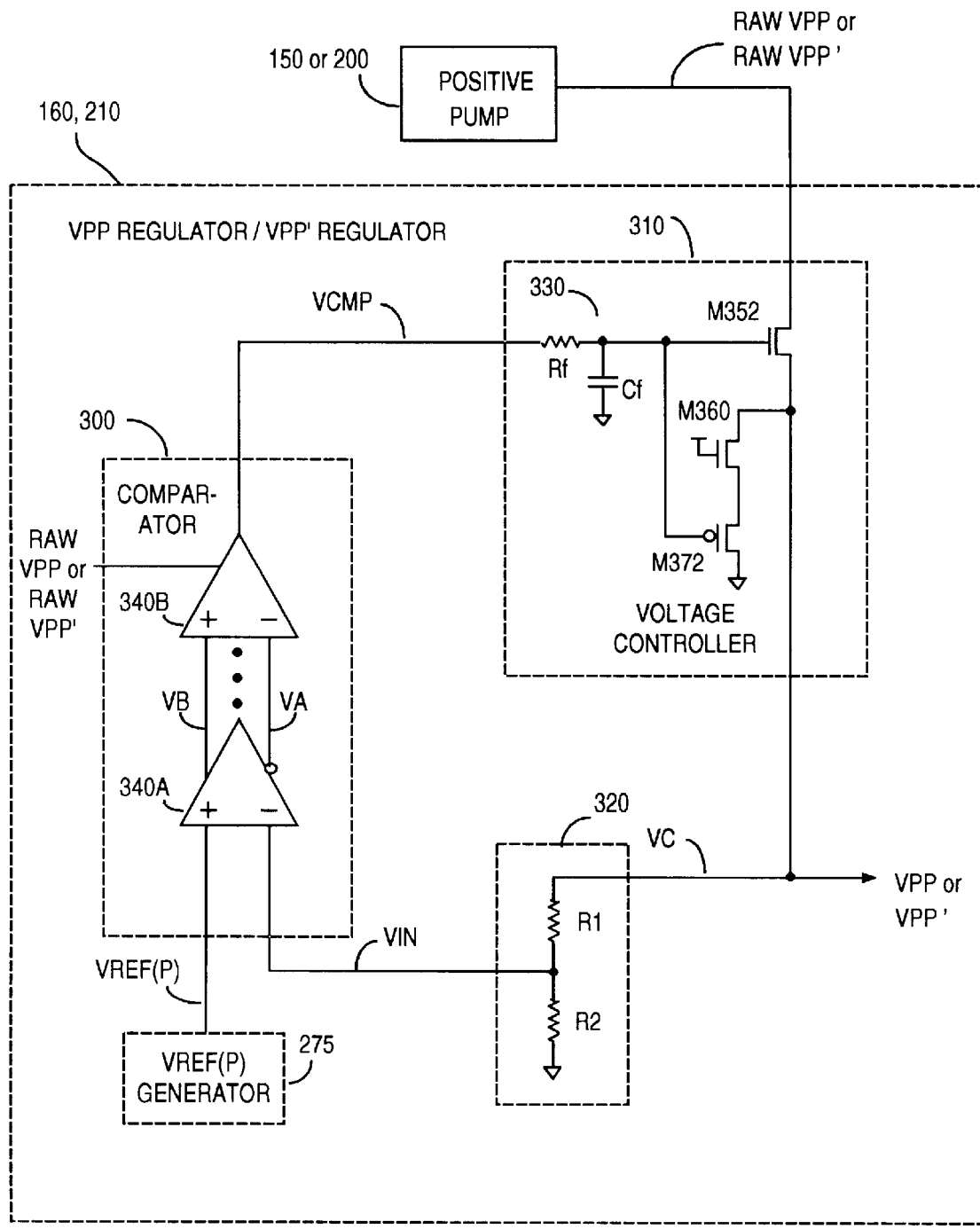
FIG. 6C is a detailed block diagram showing a third embodiment of a Vpp and/or Vpp' voltage regulator, according to the present invention.

FIG. 6C shown an alternative embodiment of Vpp and/or Vpp' regulator 180, 210. This embodiment is similar to that of FIG. 6A, except that voltage controller 310 is implemented with a PMOS M372 instead of NMOS 370, and with an NMOS M352 instead of PMOS M350. Further, output stage 340B of comparator 300 preferably includes a power supply connection to raw Vpp or raw Vpp'.

FIG. 7A depicts a first preferred implementation for Vpn regulator 240, as shown in FIG. 3. Vpn regulator 240 receives a VREF voltage, preferably from an IC on-chip VREF(N) generator 285 such as shown in FIG. 5D, and compares VREF with a scaled representation of the regulated voltage Vpn. However, as indicated by FIG. 3, with polarity inversion, comparator 300 in Vpn regulator 240 could utilize a positive reference voltage, e.g., VREF(P) from on-chip generator 275. Preferably comparator 300 is the same as that used in the Vpp, Vpp' regulators of FIGS. 6A and 6B. (See also FIGS. 5E, 5F.) From Table 3 it will be recalled that a voltage divider 320 is required to provide voltage scaling. In the embodiment of FIG. 7A resistor-resistor scaling is used, whereas in the embodiment of FIG. 7B, capacitor-capacitor scaling is used.

In FIG. 7A, voltage divider 320 comprises two series-coupled resistors R1 and R2, coupled between potentials Vd (Vpn) and Vd (here, ground). A resistively-divided fraction of the Vc potential is preferably scaled to a magnitude appropriate to the regulated output of VREF generator 285, and is coupled to the non-inverting input of stage 340A of comparator 300. Comparator 300 generates an output error signal Vcmp that is coupled as input to voltage controller 310. Voltage controller 330 filters Vcmp, and outputs the desired regulated Vpp or Vpp' potential. Error or deviations on Vpp or Vpp' are then fedback as potential Vc to voltage divider 320, and a resistive-fraction R2/(R1+R2 of Vc is present as potential Vin to comparator 300. Unfortunately, while resistive divider 320 will appropriately down-scale the magnitude of Vc to the −1.2 VDC or so provided by VREF generator 285, the resistive divider also scales down deviations on the desired regulated potential Vpp, Vpp'. Further, resistive divider 320 can conduct DC current. Note too, that because VPN is scaled down by a resistor-resistor divider, VIN and thus the VREF must both be negative. Stated differently, an additional drawback of a resistor-resistor divider is that the VREF potential will, for the configuration shown, be of the same polarity as the potential being regulated, e.g., both are negative for the configuration of FIG. 7B.

One advantage of the embodiment of FIG. 7B is that the use of series-coupled capacitors C1, C2 divide and down-scale Vpn so as to provide a potential Vin for comparator 300 that is close in magnitude to VREF, here about −1.2 VDC. Another advantage, is that VREF may be positive or negative.

Of course other voltage-scaling techniques could be used, e.g., a biased zener diode coupled in series between the inverting input to comparator 300 and the Vpn output port. The zener diode would subtract the zener voltage from Vpn and provide the difference potential to comparator 300. If the zener potential were, say, 6.8 V, and VREF were 1.2 V, then Vpn would be regulated to about 8.0 V. In practice, implementing an on-chip zener diode is not necessarily cost and production effective, but this example does demonstrate that alternative techniques may be used to scale a measure of Vpn for input to comparator 300. Ideally, it will be appreciated that while the magnitude of Vpn should be down-scaled, preferably the voltage error on Vpn should not be attenuated.

A further advantage realized by capacitive voltage division is that there will be no DC current path between Vc and Vd. Bandgap or other VREF generators, e.g., 285, can output precise voltage but can be notorious weak in their output drive capabilities. If divider 320 were to conduct DC current, the ability of generator 285 to output a stable VREF could be compromised.

Assume that there is a potential Vin at the common node between capacitors C1 and C2. Even with ideal capacitors, this node potential will gradually drop due to junction leakage currents, for example, associated with the devices at the input of comparator 300. Understandably, leakage current fluctuations in Vin can produce undesired offsets in regulator 240 output voltage Vpn. To combat such leakage current fluctuations in Vpn, regulator 350 includes a refresh mode for its capacitive voltage divider 320.

Using a refresh mode, capacitor divider 320 is periodically reset by refresh circuit 350 to an initial condition, and is then re-coupled to the present value of Vpn, which updates the magnitude of Vin. Refresh circuitry 35 includes, in this embodiment, four MOS switch devices, namely PMOS M500, M510, and NMOS devices M520, M530.

Logic signals S1, S2 are coupled to the gates of M500, M510, which devices are coupled to one or more sources of precision regulated potential Vset1, Vset2. The Vset1, Vset2 potentials are not restricted in magnitude and may be generated in various ways, and in fact, Vset1 may equal Vset2. Preferably the Vset1, Vset2 potentials will range from about 0 V to 5 V, and most preferably will be about 1.2 V, e.g., the output from a bandgap type circuit VREF(P) 275 such as shown in FIG. 5C. (As described below, a negative VREF(N) 285 generator may be used instead, in which case a negative VIN of about −1.2 V would be required.)

It may be desirable to define sets of these potentials, e.g., set1: vset1=0 V, Vset2=1.2 V, set2: Vset1=Vset2=1.2 V. Assume that VREF is in fact VREF(P), as shown in FIG. 7B, e.g., +1.2 V. But since VPN is negative, the initial value of VIN must be made positive initially, such that the steady-state VIN value is +1.2 V when the negative VPN potential is coupled to VIN.

Associated with each of the NMOS devices are voltage level shifters 360, 370, which generate a negative polarity switching voltage in response to standard low/high logic level pulses S3, S4. The voltage-translated version of S3 output by translator 360 is denoted S3', while the voltage-translated version of S4 output by translator 370 is denoted S4'. (Preferred embodiments of shifters 360, 370 are shown in FIGS. 7C-1, 7C-2, and 7D, respectively.)

The initial Vin output potential for capacitor divider 320 in FIG. 7B may be established in several ways. For example, VC and Vin may both equal Vset1 or Vset2. In a second method, Vc may be 0 V, and Vin=Vset2. In a third method, in a first step Vc=0 V and Vin=Vset2, and subsequently, Vc=Vset1, which couples Vin to 2×Vset (with Vd floating). If the second or third method to set he initial value of Vin is used, transistor M500 should e changed from a PMOS (as shown) to an NMOS, to set Vc=0 V. Note that the initial value of Vin should always be positive, to ensure comparator stage 340A functions properly with a positive magnitude VREF, when Vpn brings Vin in a negative direction.

Vin may be set positive by using a positive potential for VSET2, perhaps 1.2 V from a bandgap-type generator 275. But for VPN, a potential higher than 1.2 V is required, e.g., 2.4 V. A Vin=2.4 V potential may be achieved by coupling VSET1 to VC, to pump-up Vin=1.2 V from VSET2 to VSET2+VSET1=2.4 V, with Vd allowed to float. If VSET1 and VdSER2 are each 1.2 V, then initially Vin will be 2.4 V. During regulation of VPN, a divided-down fraction of VPN is coupled to the initial Vin=2.4 V to reduce Vin down to 1.2 V. This may be achieved by proper selection of C1 and C2 magnitudes. Of course other positive values of VSET1, VSET2 and other C1, C2 magnitudes could achieve the same desired result.

If desired, VREF(P) in FIG. 7B could be replaced by negative potential VREF(N) from generator 285, which would dictate that Vin now be about −1.2 V. Since VPN is negative, this result can be attained by setting VSET1= VSET2=0 V initially, and VD=0 V. Next, VC is made equal to VSET1 by turning-on M500, VIN is set to VSET2 by turning on M510, and VD is grounded by turning-on M520. Thus, initially, VC=0 V, VIN=0 V, and VD=0 V. During VPN regulation, M510 and M520 are turned-off, while M500 and M530 are on. The ratio between C1 and C2 is selected to scale Vin to about −1.2 V, to match the magnitude of VREF(N). The capacitor ratio selection should satisfy the following equation:

$$-1.2V = VPN \cdot \left( \frac{C2}{C1+C2} \right)$$

Generally, refresh circuitry 350 can be used to refresh as follows. Before refresh S1 is low, S2 is high, S3' is low, and S4 is high. As a result, M500 is turned-on and couples Vc to Vset1, and M530 is turned-on, and couples Vd to Vpn. Vset and Vpn are present as potentials Vc and Vd across capacitors C1 and C2, and Vin will assume a magnitude that according to capacitive voltage division.

Next, a refresh cycle begins. Sequentially, at step 1, S4 changes state such that S4' goes from high to low, turning-off M530, which isolates Vd from Vpn. At step 2, S2 goes from high to low, turning-on M510 to couple Vin to Vset2, while S3 causes S3' to go from low to high, turning-on M520, and grounding Vd. Thus, at this second step, potential Vin is refreshed to Vset2, potential Vd is refreshed to ground, and potential Vc remains coupled via M500 to Vset1. In a third step, S2 returns high, turning-off M510 and isolating Vin from Vset, and S3' returns low, turning-off M520 and isolating Vd from Vpn. At a fourth step, S4' returns high to turn-on M530 and couple Vd to Vpn. At this point, the refresh cycle is finished, and the fraction of Vpn that couples to Vin is given by the capacitor ratio C2/(C1+C2).

In the above example, S1 is always low, which keeps M500 turned-on such that Vc is held at the precise magnitude of Vset1. In an alternative embodiment, after the fourth step, S1 can be brought high to isolate Vc from Vset1. In such embodiment, when M500 turns-off, Vc floats and capacitor C1 makes no further contribution to the capacitive divide ratio that sets Vin. This embodiment permits essentially all change in Vpn (rather than a capacitive-divided fraction of the change) to be coupled to Vin. This ability to couple essentially all change in Vpn substantially improves regulation as contrasted to prior art regulators that use more conventional voltage dividing techniques. The present invention increases the effective gain of the regulator, in part by coupling essentially all of the Vpn change back to the comparator.

If the above-described capacitor voltage-divider and isolation technique is not used, the S1 signal and its associated device M500 may be removed. Node Vc may then be coupled directly to 0 V or to Vset1. As noted, the precise magnitude of Vset is not critical, provided its magnitude is precisely maintained. It is for this reason that a bandgap-type precision voltage generator such as shown in FIG. 5C is preferred to provide the Vset1 and/or Vset2 potential.

As noted, Vin is reset during a refresh cycle, which means comparator 300 is temporarily without function. Understandably, if voltage controller 310 were to continue to receive a voltage VCMP as a control signal, regulator 240 may cause VPN to go out of control. Thus, voltage controller 310 includes a sample and hold unit 380 that samples and temporarily retains the last value of VCMP before a refresh cycle is started. During this interim time, voltage controller 310 regulates VPN according to the VCMP voltage held in unit 380. Upon completion of a refresh cycle, sample and hold circuit 380 returns to a normal sampling status.

As shown in FIG. 7B, the VREF output of sample and hold unit 380 is coupled to buffer transistors M540, M550, M560, whose grand output is the regulated voltage Vpn. (FIG. 7E depicts a preferred implementation of sample and hold unit 380.) Again, it will be apprreciated that the Rf-Cf lowpass filter in voltage controller 310 could be implemented using the channel impedance of the NMOS-PMOS devices used to implement sample and hold unit 380 as Rf, and using the Csample capacitor as the Cf filter capacitor.

Figure 7C:
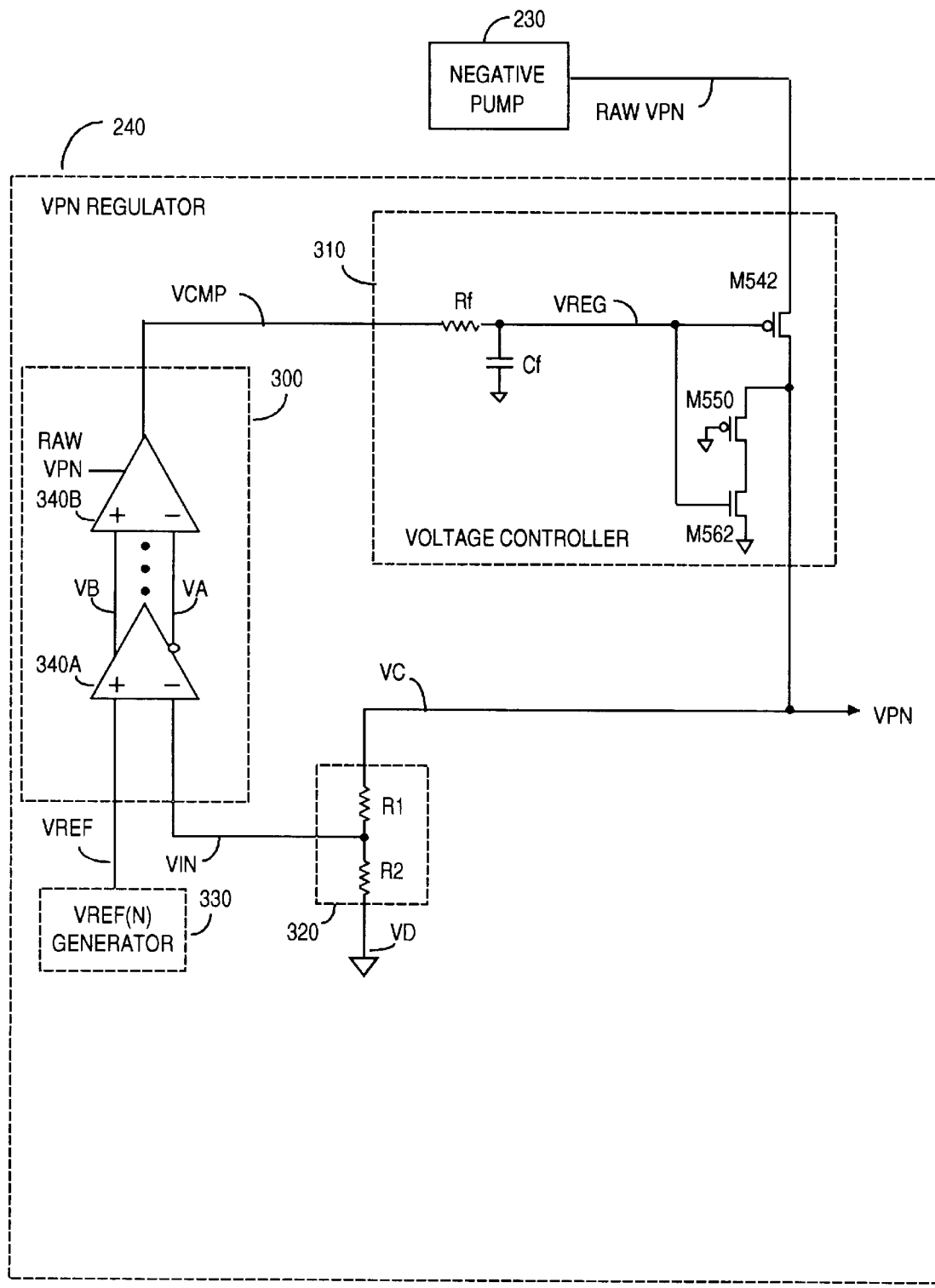
FIG. 7C is a detailed block diagram showing a third embodiment of a Vpn voltage regulator, according to the present invention.

In the alternative embodiment of FIG. 7C, VPN regulator 240 provides as a power supply raw Vpn to output stage 350B of multi-stage comparator 300. Within the voltage controller 310, PMOS M542 replaces NMOS 540, and NMOS 562 with a ground source lead replaces PMOS M560, as was shown in FIG. 7A.

As noted, generation of control signals S3' and S4' requires level shifters 360, 370 to generate negative high voltage signals from S3 and S4, to switch-off NMOS devices M520, M530. However, when switching a conventional level shifter conducts excessively large current from the VDD node to the pumped negative voltage node. Such excess switching current in turn can result in excessive ripple on the negative voltage that is required to generate S3' and S4'. As shown in FIGS. 7D-1, 7D-2, and 7E, the present invention utilizes a new form of circuitry to implement level shifter 360 and/or 370.

Figure 1:
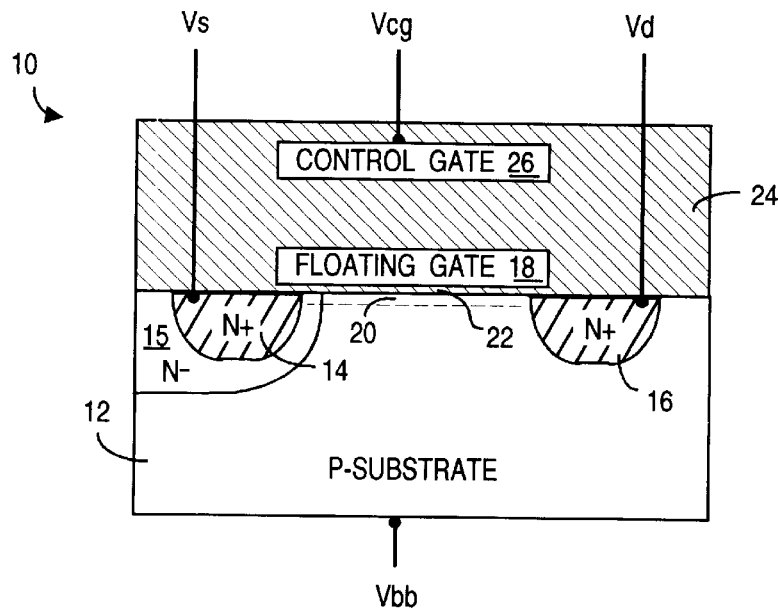
FIG. 1 depicts a conventional EPROM-type storage cell, according to the prior art.
Figures 1, 7D:
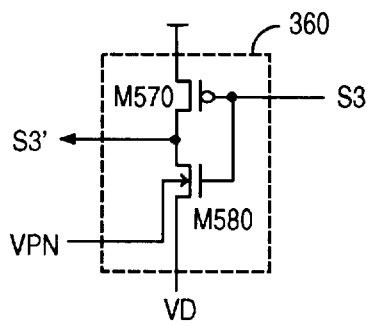
Figures 2, 7D:
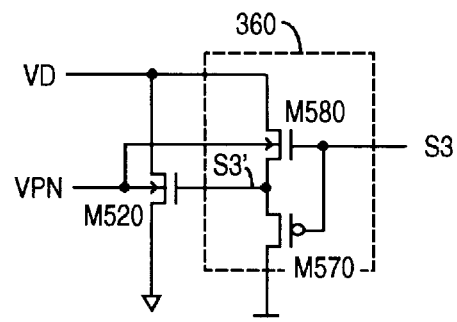
Figure 7E:
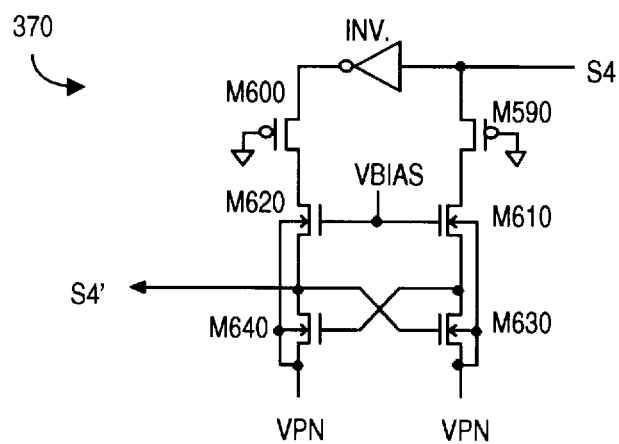

FIG. 7D-1 depicts a first preferred implementation of level shifter 360, whose input is S3 and whose output is S3', which is coupled to the gate of NMOS device M520. Shifter 360 preferably comprises a PMOS-NMOS pair, M570, M580, coupled between Vdd and Vd, with the substrate of NMOS M580 also coupled to VPN. It is seen that when S3 is low, e.g., Vdd or ground, S3' will be ground or Vd.

In the alternative embodiment of level shifter 360 shown in FIG. 7D-2, when S3=Vdd, M580 is on, and M570 is off. The negative VD potential is coupled to node S3' by M580 (which is on), which negative potential turns-off device M520 (see FIG. 7B). The above conditions are used when monitoring VD. On the other hand, in refresh mode, S3=0 V, which turns M570 on, bringing node S3' to Vdd potential. This turns on M520, which then discharges VD to 0 V.

FIG. 7E shows a preferred implementation of level shifter 370, which comprises preferably matched PMOS devices M590, M600, and preferably matched NMOS devices M610, M620, M630, and M640, as well as an inverter INV, which may be implemented with a PMOS-NMOS transistor pair. When S4 is Vdd or is ground, S4' is VPN or (VBIAS-Vtn), where Vtn is the threshold voltage for an NMOS used in circuit 370. The VBIAS potential may be ground or any negative voltage, for example a potential derived from VPN using a resistor-divider or the like.

Figure 7F:
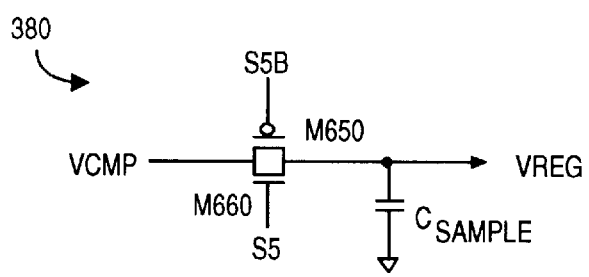
FIG. 7F depicts a preferred implementation of a sample and hold circuit such as used in the embodiment of FIG. 7B, according to the present invention.

FIG. 7F is an exemplary circuit for sample and hold unit 380, used in the Vpn regulator embodiment of FIG. 7B. In FIG. 7F, prior to the first step in a refresh cycle, S5 goes to ground, and S5B goes to Vdd (or to Vpp or VPN, depending upon the voltage level of VCMP output by comparator 300). These logic states hold the sample value of VCMP in hold capacitor Csample, to temporarily represent a VREG voltage level to be input to transistors M540, M550, M560. Upon end of a refresh cycle, S5 and S5B return to VDD (or VPN or VPP, depending upon the VCMP level output by comparator 300) and GND, respectively, which permits the current value of voltage VCMP to be passed directly as the VREG volt age.

Thus far, FIGS. 3–7F have been described with respect to operation of the Vpp regulator 160, the Vpp' regulator 210, and the Vpn regulator 240, which regulators output respectively Vpp, Vpp' and Vpn. Referring briefly to FIG. 3 and FIG. 4, it is seen that the Vpp potential from Vpp regulator 160 (see FIGS. 6A and 6B) is used as input to BL regulator 170 and to SL regulator 180.

Figure 8:
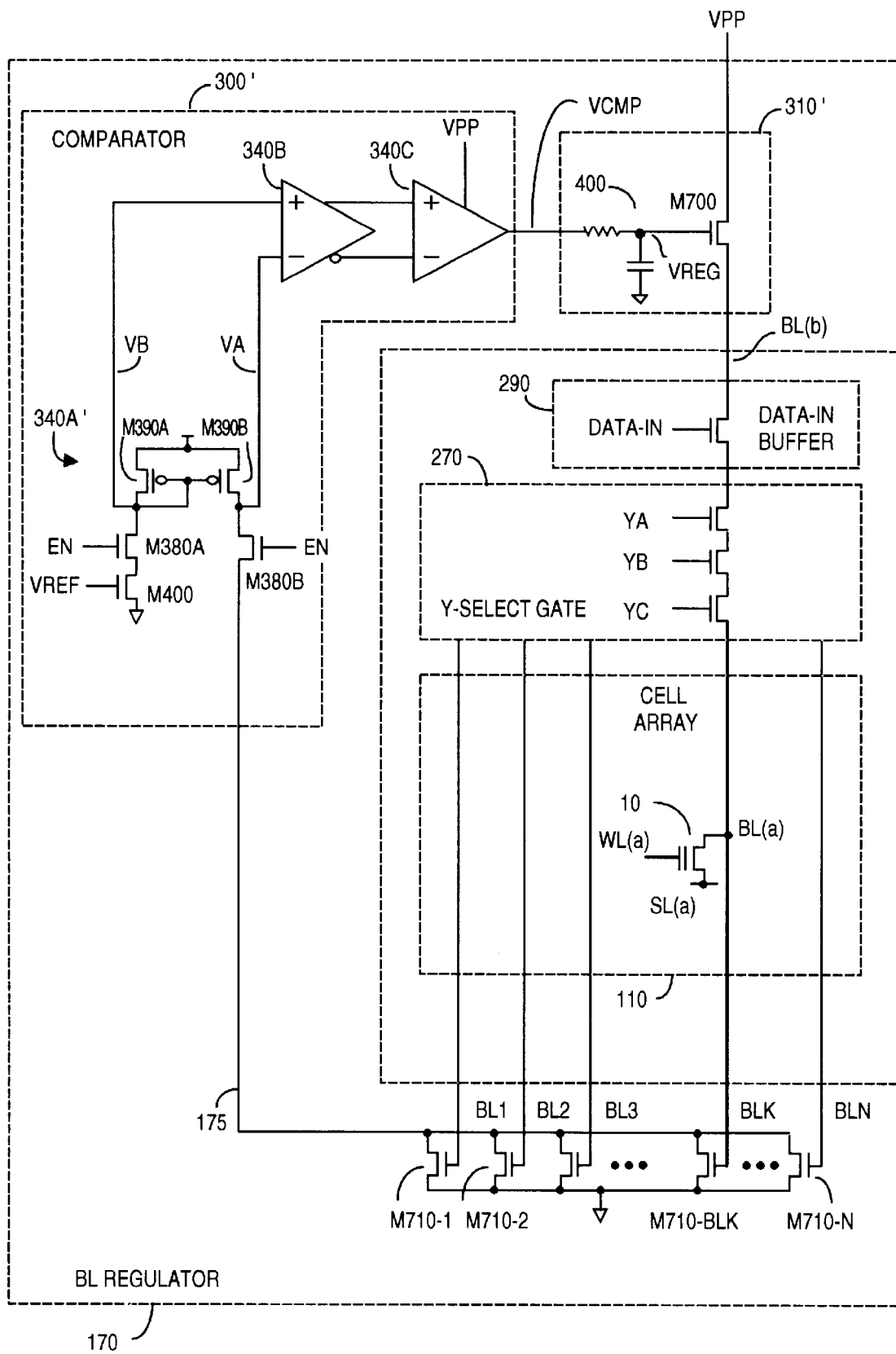
FIG. 8 depicts a preferred implementation of a bitline voltage regulator, according to the present invention.
Figure 10A:
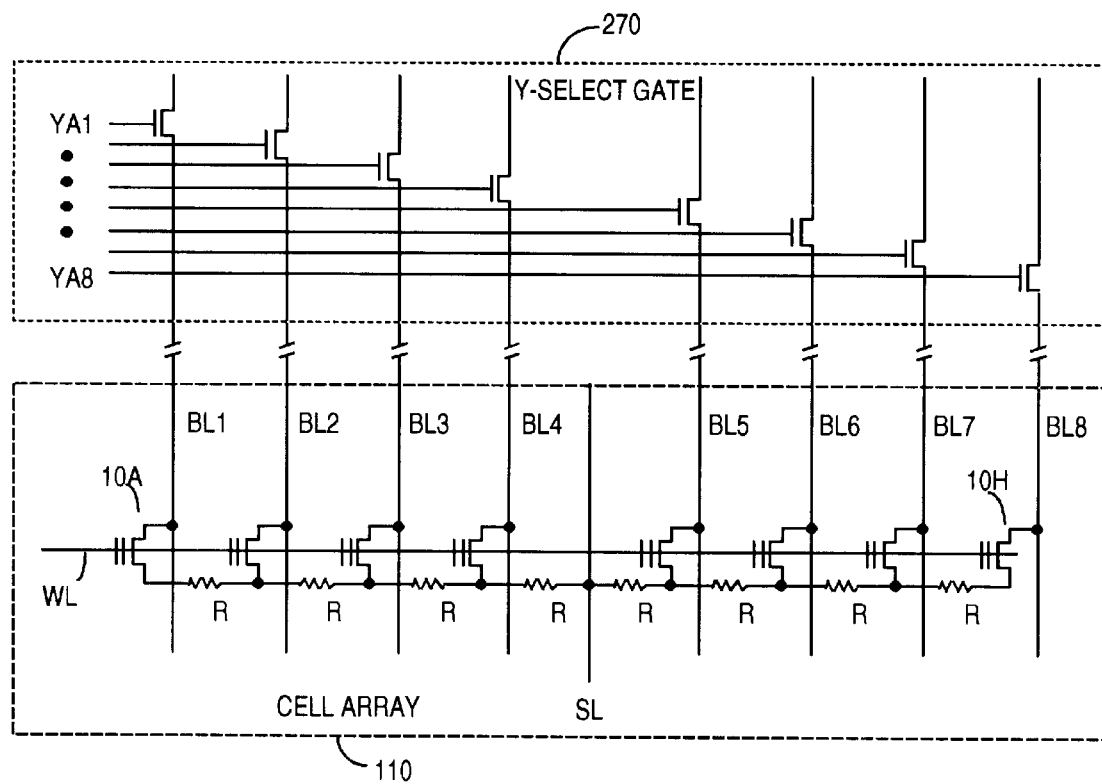
FIGS. 10A and 10B depict circuitry to vary VREF for BL and SL regulators to compensate for target cell location path lengths, according to the present invention.
Figure 10B:
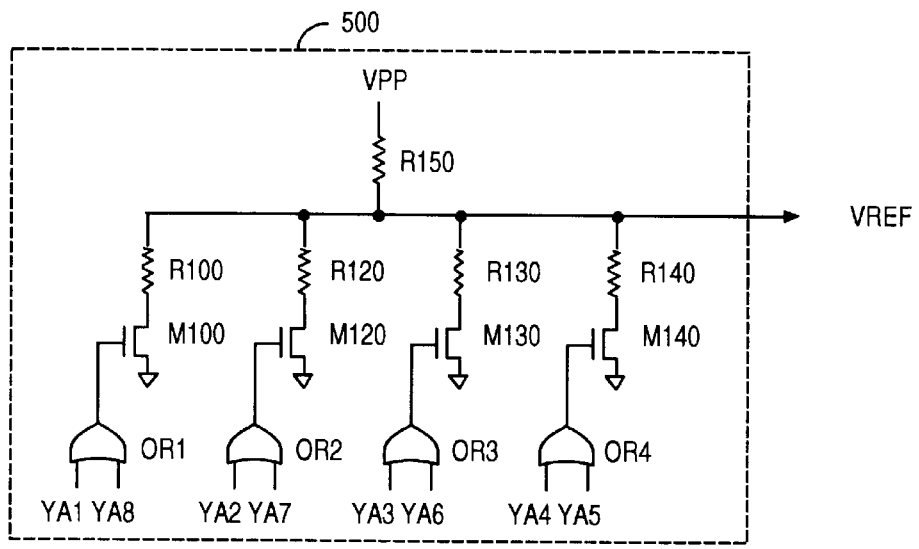

BL regulator 170 operation will now be described with reference to FIG. 8, which also depicts various subsystems described with reference to FIG. 3, e.g., data-in buffer 290, Y-select gate 270 (responsive to YA, YB, YC inputs), memory cell array 110, as well as feedback loop 175. (Again it is understood that feedback loop 175 in fact can couple hundreds or more of BLs back into comparator 300' for voltage sensing.) BL regulator 170 functions to regulate the selected BL to a positive high voltage during a cell program operation. In FIG. 8, the VREF input to comparator 300' will typically be the desired BL voltage, e.g., 5 V. Comparator 300' will compare this precisely controlled VREF voltage with a measure of the actual voltage on the selected BL (obtained via feedback loop 170), and will modify the comparator output signal Vcmp accordingly. However, as shown in FIGS. 10A, 10B, the magnitude of VREF may be automatically adjusted as a function of the address location of the target memory cell, so as to help maintain the same BL at the target cell, despite varying metallization path lengths involved in delivering voltage to the cell.

In programming mode, Y-select gate 270 will select a single BL, e.g., BL(a), from a plurality of BLs, for example from one of eight groups that each comprise N BLs: BL1, BL2, . . . BLN. As such, BL regulator 170 is replicated eight times, such that each regulator 170 regulates a single selected BL to a selected BL voltage of, preferably, 5 V. The eight BL regulators 170 perform independently from each other. Note that if each of YA, YB, YC represents eight BLs, collectively 8×8×8 or 512 BLs are representable. However, of the 512 (or other number) of represented BLs, a single BL is selected, and all other BLs are unselected.

Thus, as will now be described, it is only the one selected BL whose BL voltage biases on one of devices M710-1 . . . M710-N to provide a measure of selected BL potential to the input of comparator 300'. The selected BL will receive a high BL voltage from the output of voltage controller 310', whereas all other (e.g., unselected) BLs will be at ground potential. In programming operation, the threshold voltage of a selected memory cell 10 is changed so as to cause the cell channel current to change from approximately 1 mA to perhaps 200 μA. Understandably, this can represent a large change in the voltage of the selected bitline, e.g., BL(a) in FIG. 8. For this reason, the demands placed upon BL regulator 170 are more severe than, for example, the requirements imposed upon Vpp regulator 160 (shown in FIG. 4). For example, parasitic impedance changes in the BL signal path can cause undesirable BL voltage changes at the high current levels involved. Such voltage changes can also result from devices such as M700 that are gated-in by Data-in Buffer 290 and YA. However, as will now be described applicants' BL voltage regulator is able to deliver a finely regulated (e.g., ±1%) BL voltage under essentially all operating conditions.

Thus, BL regulator 170 benefits from an increased controllability in its voltage controller unit 310', and accordingly comparator 300 (shown in FIGS. 6 and 7) is modified (and referred to as comparator 300') to include three stages, denoted 340A', 340B, and 340C. Note that third stage 340C is coupled to Vpp (rather than lower value Vcc) as a power source. This permits comparator 310' to provide a control signal VREG that can be as high as Vpp, rather than be limited by Vcc. To help stabilize BL regulator 170, voltage controller 310 (now referred to as voltage controller 310') includes an R-C lowpass filter 400. The present of filter 400 tends to promote stability of the potential at VREF and at BL(b).

As noted, preferably all of the present invention is implemented on a single IC 100, along with the memory array, voltage pumps, and other circuitry, similar to the inclusion of circuitry shown in FIG. 2. However, due to the limitation of BL pitch, it is necessary that a single BL regulator circuit 170 be shared by a plurality of BLs, to save space on IC 100.

To meet this requirement, first stage 340A' of comparator 300' is modified to receive multiple inputs from multiple BLs (e.g., BL1, BL2, . . . BLN) as selected by NMOS devices M710-1, M710-2, . . . M710-N, as shown in FIG. 8. Advantageously, because these NMOS have a BL coupled to a gate (as opposed to a source or to a drain), the NMOS device size may be small, e.g., W/L≈1.2/2 perhaps. Thus, a plurality of these NMOS devices may be implemented on IC 100 within the tight pitch limitation associated with typical BL layout.

Assume that the selected BL is bitline BLK, which is coupled to BL(a) through Y-select gate 270 and data-in buffer 290 (see also FIG. 4). As it is the selected BL, BLK will receive regulated high voltage from BL regulator 170. All other BLs, e.g., all unselected BLs, are automatically grounded. Thus, NMOS transistors M710-X having gates coupled to unselected bitlines will be biased-off, whereas the one NMOS, e.g., M710-BLK, whose gate is coupled to the selected BL will be biased actively on.

Preferably M710-BLK (and indeed all of the NMOS devices M710-1 . . . M710-N) is substantially identical to NMOS M400 within the first stage 340A' of comparator 300. As such, when enabling signal EN is coupled to pass transistors M380A, M380B, a differential voltage comparison between VREF (which is input to the gate of device M400) and selected BL voltage (which is input to the gate of substantially identical device M710-BLK) occurs within input stage 340A'. As such, feedback path 175 (see also FIG. 3) is established between the selected BL and the input to comparator 300'.

This difference between the selected BL and the unselected BLs follows because a relatively high WL voltage is provided to memory cells coupled to the selected WL. This high WL potential turns-on all cells on the selected WL, and will pull to ground the various unselected BLs, e.g., BL1, BL2, . . . but not the selected BL, here BLK, which has high voltage from voltage controller 310' to sustain its high voltage. Thus of the potential multiple inputs available to comparator stage 340A, only the ungrounded selected BL, here BLK, remains a valid input. As a result, without requiring a decoding circuit, the potential of the selected BL is compared within comparator 300' directly with the VREF potential.

VREF is the desired high voltage, perhaps +6 VDC, and is derived from the regulated VPP output by the Vpp regulator 160 (see FIG. 3). It is noted that because both BLK and VREF potentials are high voltage, devices M710-BLK and M340A' device M400 disadvantageously function in linear mode, which degrades voltage gain of comparator stage 340A'. More preferably, devices that receive input voltages should be operated in saturation mode to ensure high gain stage and overall comparator gain. However, this problem is overcome by applicants' multi-stage comparator 300', e.g., see FIGS. 8 and 9.

Referring back briefly to FIGS. 5E and 5F, the first stage 340A of comparator 300 was only required to track variations present in VREF and Vin. However, referring now to FIG. 8, when BLK≈VREF, then VA≈VB, independently of variations in the circuit, including without limitation power supply variations. As such, in FIG. 8, input stage 340A' does not perform an actual high gain comparator function, but merely outputs VA and VB signals in Vcc and ground levels. This in turn permits the following stage 340B to function in a high gain regime, which enables comparator 300' to provide sufficient voltage gain for good operation of BL regulator 170, notwithstanding the low voltage gain associated with input stage 340A'. Of course, more conventional single-ended comparator configurations would indeed suffer poor performance due to high sensitivity to Vdd variation, with resultant poor precision in the regulation of the BL voltage. Note also that different magnitude BL regulated voltages may be generated simply by changing the value of VREF.

SPICE computer simulations of applicants' BL regulator 170 demonstrate that, for example, a +5 V BL output voltage can be held to ±1% (e.g., ±50 mV) variation over a Vcc power supply range of 2 V to 6 V, an ambient temperature variation of −50° C. to +125° C., memory cell current variation from 50 μA to 600 μA, and Vpp high voltage varied from +7 V to +9 V, as well as extremes or corners of process variations. In short, applicants' BL regulator is substantially insensitive to variation in power supply ambient temperature, cell current, and fabrication process. Applicants' comparator circuit 300 appears to be responsible in large part for this performance, as well as the presence of feedback loop 175.

Figure 9:
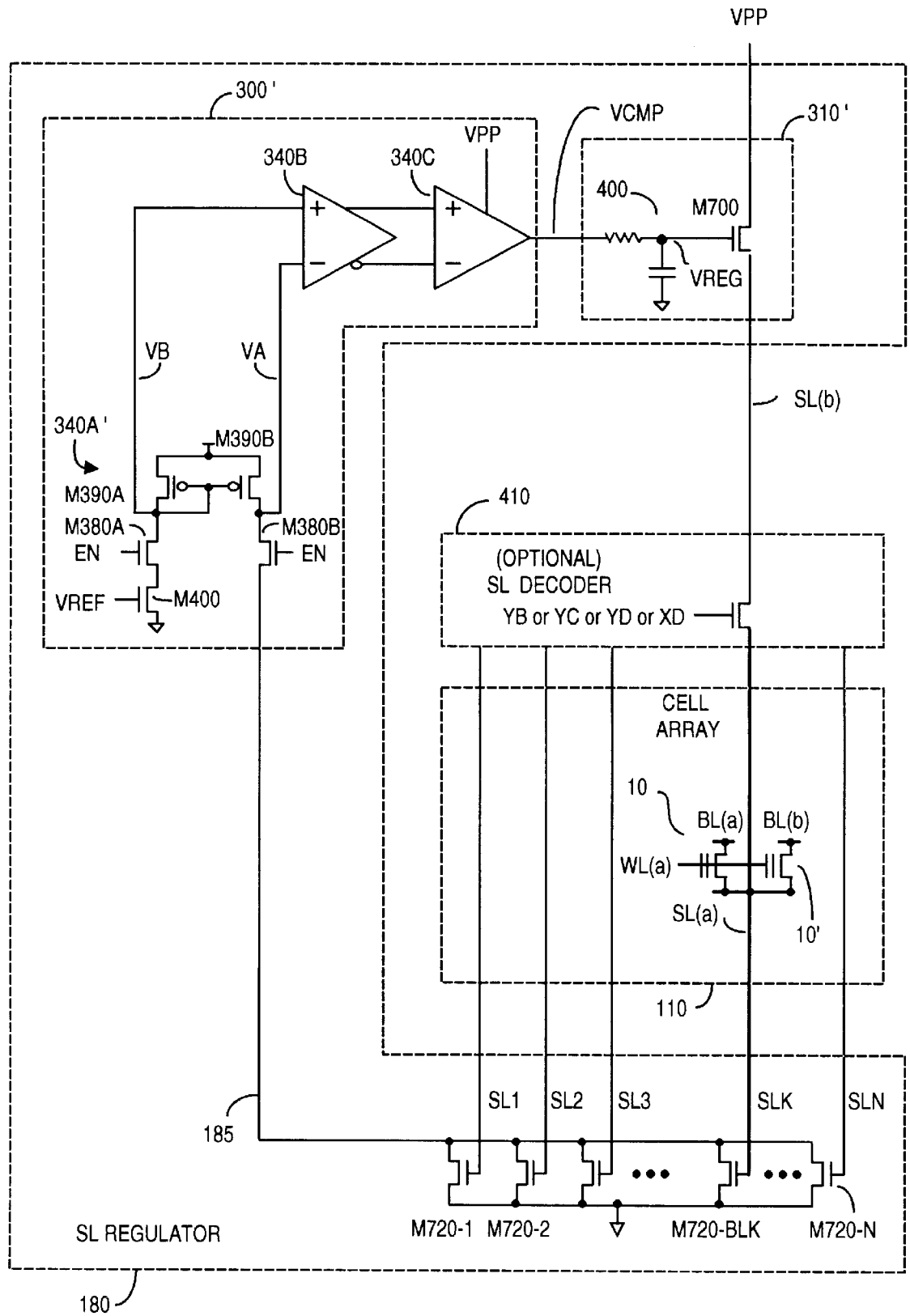
FIG. 9 depicts a preferred embodiment of a sourceline regulator, according to the present invention.

A preferred embodiment of a sourceline regulator 180 will now be described with reference to FIG. 9. As shown in FIGS. 3 and 4, SL regulator 180 receives regulated Vpp from Vpp regulator 160 and regulates the selected SL to desired positive high voltage during a cell program operation. FIG. 9 depicts a preferred embodiment for SL regulator 180. Also shown in FIG. 9 are various subsystems described earlier herein, e.g., memory cell array 110 (in which two exemplary cells 10, 10' are depicted out of a greater number of cells), feedback loop 185, preferably triple-stage comparator 300', and voltage controller 310'. (Again, it is understood that feedback loop 185 can couple hundreds or more of SLs back into comparator 300' for sensing.)

FIG. 9 also shows an optional SL decoder unit 410 that may be similar in operation to Y-select gate 270, shown in FIG. 8. However, logic signals controlling the SL decoder may be obtained from X-decoder 280 (e.g., signals YC, YD) or from Y-decoder or select gate 270 (e.g., signal YB). In some respects the SL regulator 180 of FIG. 9 is similar to the BL regulator of FIG. 8. In FIG. 9, the magnitude of VREF input to comparator 300' will be the voltage value desired for the selected SL, e.g., perhaps 5 V. However, as shown in FIGS. 10A, 10B, the magnitude of VREF may be automatically adjusted as a function of the address location of the target memory cell, so as to help maintain the same SL at the target cell, despite varying metallization path lengths involved in delivering voltage to the cell.

As noted, SL decoder 410 is optional and indeed many conventional memory arrays 110 do not provide a SL decoder. For such applications, the present invention connects SL(b) to only one SL(a) and uses the first stage 340A' of comparator 300' single-endedly. Stated differently, each SL uses a dedicated SL regulator 180. But since a SL typically is shared by from 8 to 128 (or more) BLs, SL pitch is large, and in fact accommodates a dedicated SL regulator on IC 100.

As noted, if the VREF input to comparator 300' is changed (or changes) in BL regulator 170 (FIG. 8) or in SL regulator 180 (FIG. 9), the relevant BL or SL potential at the target cell changes. FIGS. 10A and 10B depict circuitry to automatically vary the magnitude of VREF as a function of target cell location to compensate for IR-ohmic type voltage losses along the conductive path length to the target cell.

FIG. 10A depicts the relationship between Y-select gate 270 and cell array 110, in which eight bitlines are shown, denoted BL1 . . . BL8, and eight memory cells are shown, denoted 10A . . . 10H. In programming mode, select signals YA1 . . . YA8 will select a single bitline, to which a high voltage is coupled. The associated SL will be grounded. Typically the vertically oriented SL is fabricated from metal, which has low ohmic loss. the horizontally oriented SL is typically fabricated using a diffusion process, and exhibits are higher ohmic loss along the horizontal SL length. In FIG. 10A, memory cells 10A and 10H will thus exhibit a larger SL resistance to the cell than will the other cells shown.

As noted, during program mode, relatively large source currents are present, and the IR ohmic voltage losses associated with cells 10A and 10H can produce a lower SL potential at these cells than at other cells in the array portion shown. Accordingly, one aspect of the present invention compensates for such address-dependent ohmic loss by increasing the magnitude of the program mode voltage associated with BL1 and BL8 relative to the other BL voltages. Referring to FIG. 10B, a programmable VREF generator 500 includes a number of resistor dividers, e.g., R150 and R100, R150 and R120, R150 and R130, etc., which resistively divide-down Vpp to provide a desired magnitude of VREF. Logic gates OR1 . . . OR4 enable a chosen one of switching transistors M100 . . . M140, in response to the BL-select signals YA1 . . . YA8. By appropriately scaling the various resistor values such that R100>R200>R300>R400, it can be assured that the magnitude of VREF output by Vref generator or divider 500 is greater for memory cells requiring the larger voltage, e.g., cells 10A and 10H in the present example. The ability to varying VREF magnitude in proportion to ohmic losses associated with target cell addresses eases the regulation burden and design of the associated BL or SL voltage regulator.

Figure 11:
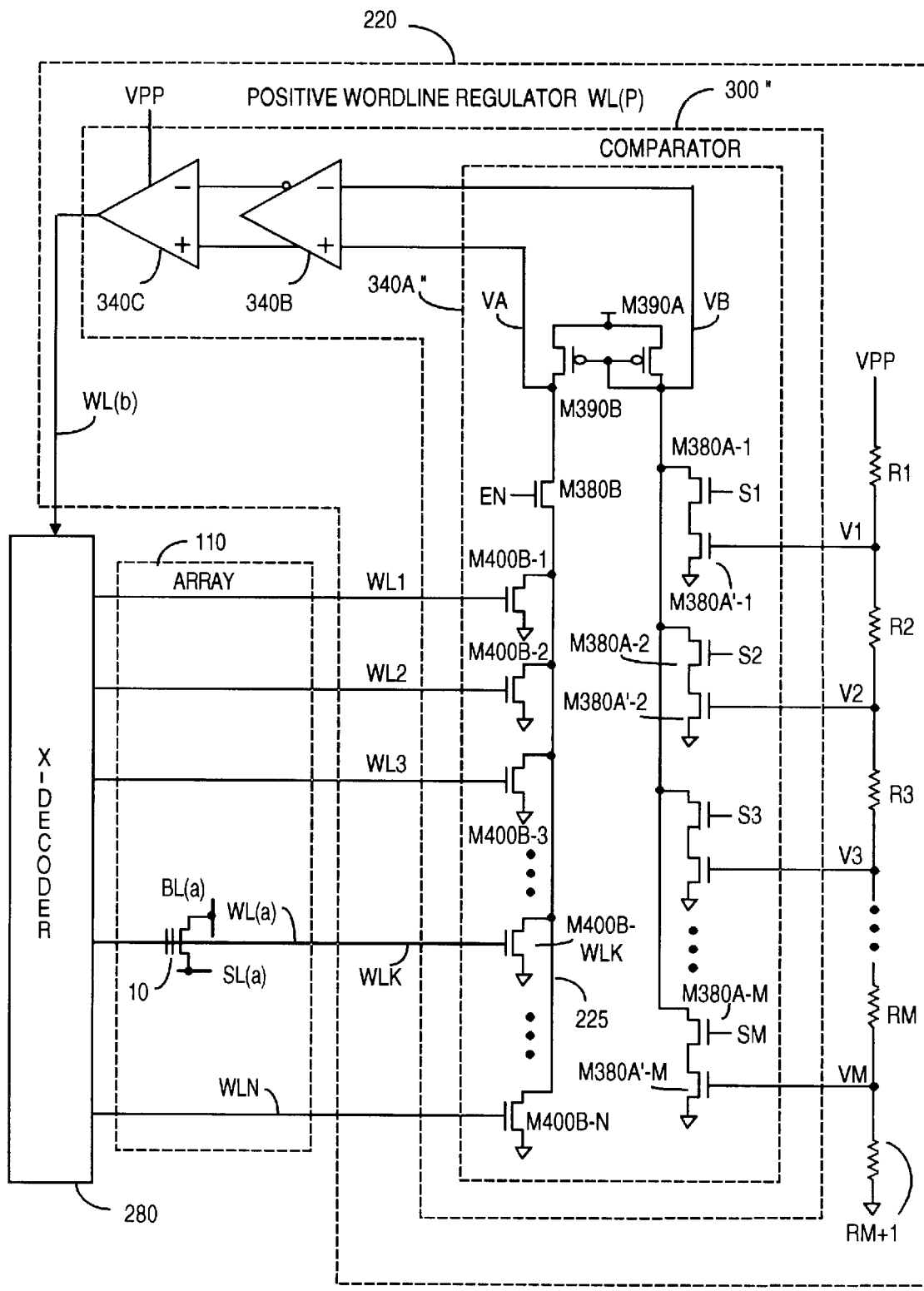
FIG. 11 depicts a preferred embodiment of a positive voltage wordline regulator, according to the present invention.

FIG. 11 depicts a preferred embodiment of a positive wordline ("WL(P)") regulator 220. As was shown in FIG. 3, WL(P) 220 receives regulated Vpp' voltage from Vpp' regulator 210, and provides a regulated positive WL(P) potential to selected WLs. As indicated by Table 2, the WL(P) potential may be as high as +10 V in program operations, and perhaps +6.5 V in program verify operations.

Referring to FIG. 11, WL(P) regulator 220 includes a modified input comparator 300", that similar to the comparators used in the BL regulator of FIG. 8, and in the SL regulator of FIG. 9, preferably includes three differential stages. The second and third stages 340B, 340C may be identical to various of the comparator stages earlier described herein.

The input stage, denoted 340A", is coupled to a measure of Vpp that is divided by a resistor string comprising R1, R2, . . . Rm+1, and is also coupled to one of multiple WL voltages, e.g., WL1, WL2, . . . WLK. Note that an NMOS device, e.g., M400B-1, M400B-2 . . . M400B-N is coupled to the end of each WL. Similar to what was described with respect to BL regulator 170 (see FIG. 8), non-selected WLs will be grounded, and thus the selected WL voltage automatically becomes the only non-zero voltage that will be presented, in terms of drain-source current in the associated NMOS device coupled to feedback path 225 to the input of comparator 300".

At the input of comparator 300", logic signals S1, . . . SM selected one of the resistor string node potentials, e.g., V1, V2, . . . Vm to be the VREF input voltage to the comparator. For example, if S1 is high, then S2-Sm are low, and thus VREF will be the V1 potential, present between resistors R1 and R2 in FIG. 11.

Operation of positive WL(P) regulator 220 is such that the selected WL, e.g., WLK, will be regulated to the selected VREF potential, here potential V1. As earlier described, the input stage of comparator 300" will output two signals Va, Vb, which are differentially presented to the comparator second stage 340B, whose differential output is coupled to comparator third stage 340C. As described earlier, comparator 300" advantageously will substantially eliminate the effects of environmental and process and power supply variations that would otherwise degrade WL(P) regulation performance.

In the preferred embodiment, the multiple WL voltages are used to generate precise WL voltage not merely for erase, program, repair and verify mode, but may also be used in read operation of a multiple level memory cell ("MLC") 10. Those skilled in the art will recognize that in compressed flash memory technology, MLCs can store multiple analog values, rather than just a digital or binary value.

MLCs rely on the ability of a memory cell 10's threshold voltage having many analog values. For example, a four-level MLC may store four different Vt values, e.g., Vt1, Vt2, Vt3, Vt4, to store data 0, 1, 2, 3 values. Modern MLCs can store four stages, eight states, and even sixteen data states. When an MLC is to be read, it is necessary to couple multiple WL voltages to the selected WL, while non-selected WLs are grounded. For this reason, a precise WL voltage regulator such as shown in FIG. 11 is especially desirable. In a preferred embodiment, multiple WL voltages, appropriate to an array of MLCs, is generated by sequentially presenting logic select signals S1, S2, . . . Sm. So doing results in providing a sequence of VREF voltages, V1, V2, . . . Vm. The result is a stair-step pattern of precise positive WL voltages WL(b) that are output by comparator 300".

Figure 12:
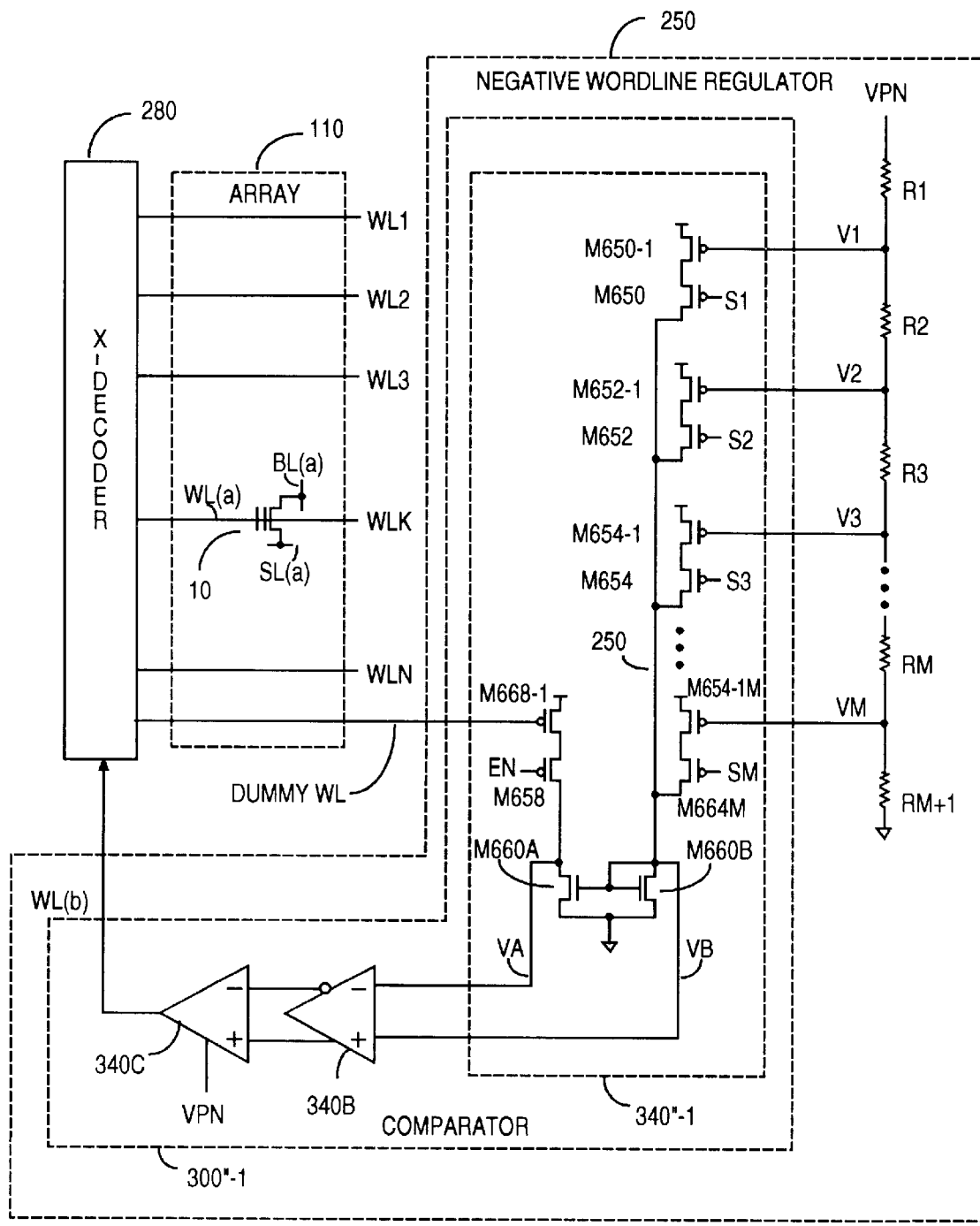
FIG. 12 depicts a preferred embodiment of a negative voltage wordline regulator, according to the present invention.

FIG. 12 depicts a negative WL regulator 250, whose operation is somewhat similar to positive WL regulator 220, described above with respect to FIG. 11. In many array operations, a precise negative WL potential is required, for example, in erase mode, many selected WLs will be coupled to perhaps −8 V. Because many WLs would be coupled to a negative potential, e.g., −8 V, NMOS devices cannot be coupled to the end of each WL, as was the case in the positive WL regulator of FIG. 11. Accordingly, a PMOS device M668-1 is used, whose gate is coupled to a single dummy WL.

Similar to what was described in FIG. 11, a resistive voltage divider string is used, to divide Vpn potential into different potential magnitudes V1, V2, . . . Vm, e.g., −2 V, −3 V, . . . −8 V, −9 V.

Figure 13:
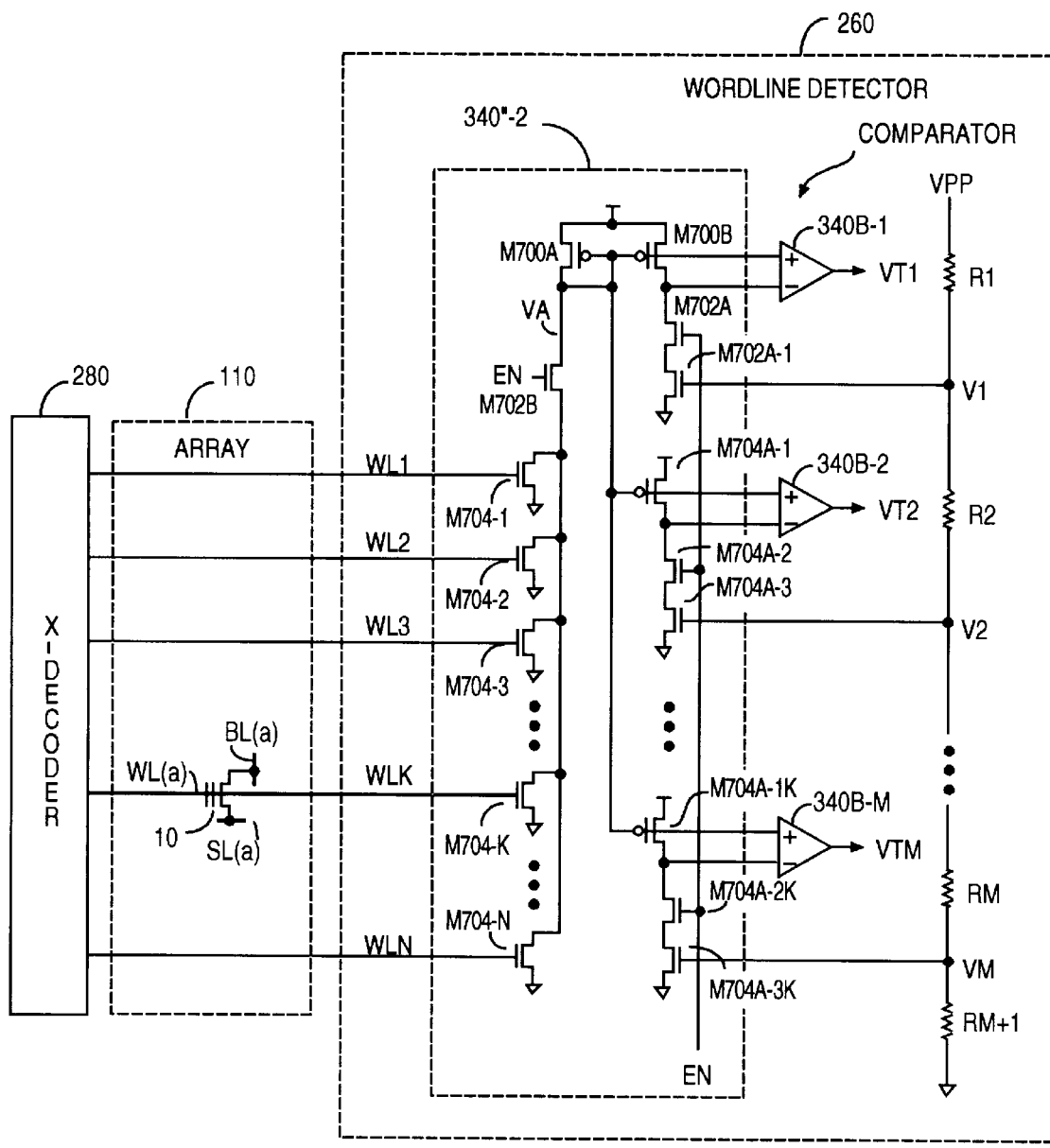
FIG. 13 depicts a preferred embodiment of a wordline detector, according to the present invention.

FIG. 13 depicts a WL detector 260 that may advantageously be used to read MLCs. In this embodiment, selected WL potentials may be ramped-up or ramped-down, as contrasted to being increased or decreased in magnitude step-wise. The function of WL detector 260 is used to detect, rather than to regulate, WL voltage.

As with embodiments described earlier herein, a differential multiple stage comparator is used, and the comparator input stage 340"-2 receives multiple inputs from the WLs and multiple informs for reference voltages V1, V2, . . . Vm. However, to shorten read speed, multiple second stage comparators 340B1, 34OB-2, . . . 34OB-M are parallel-coupled to the first comparator stage 340"-2. As shown in FIG. 13, first stage 340"-2 outputs signal pair Va, Vb-x to the differential inputs of each parallel-processing second stage comparator 340B-1, . . . 340BM.

Thus, when the selected WL is voltage ramped-up and the voltage magnitude reaches Vm, . . . , V2, V1 sequentially, the outputs of the second stage comparators, Vtm, . . . Vt2, Vt1 will respectively go low, permitting MLC reading. If desired, the parallel second stage comparator configuration may also be used to regulate the WL voltage. However, parallel comparators in a WL voltage regulator would unduly increase current consumption.

Figure 14:
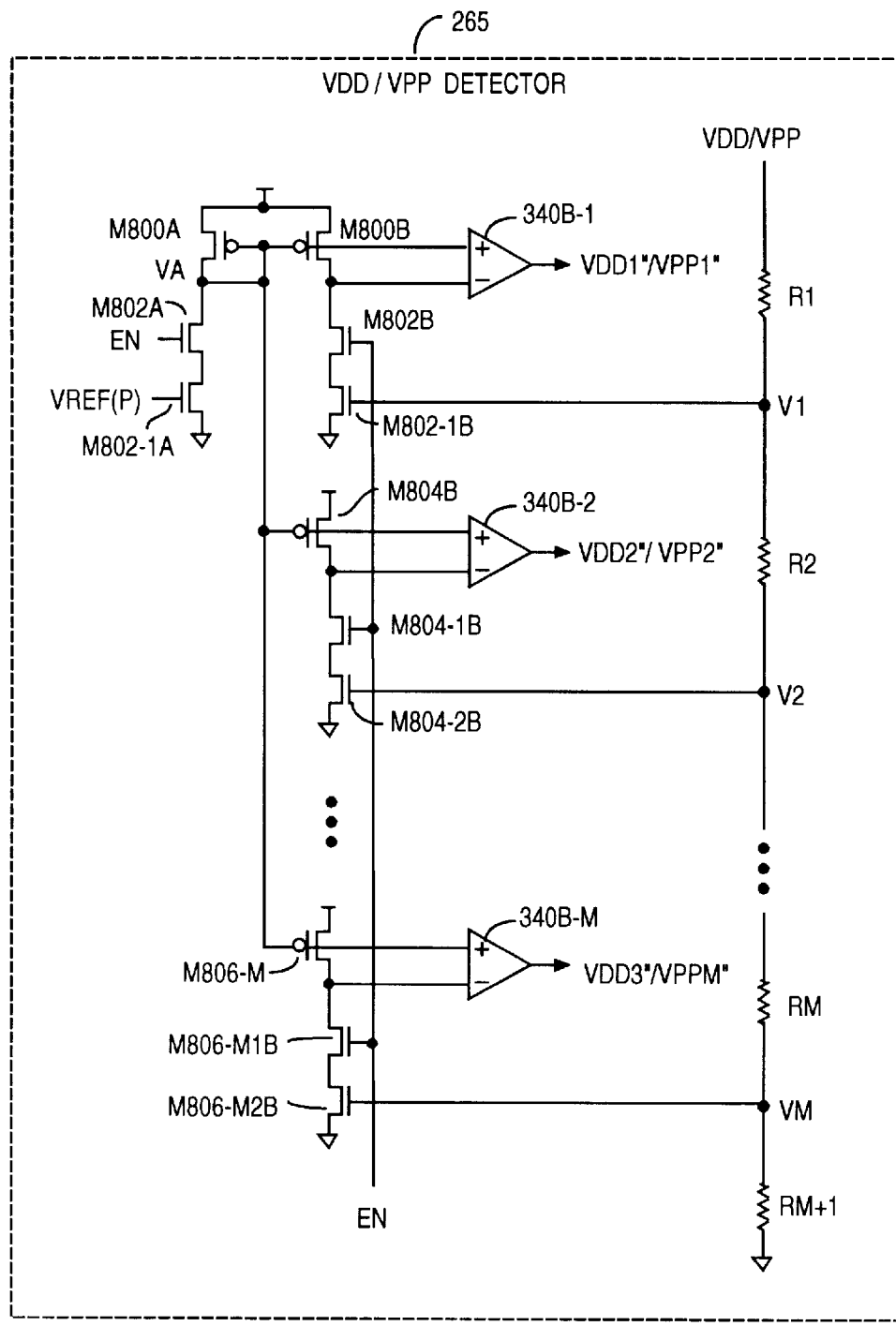
FIG. 14 depicts a preferred embodiment of a Vdd/Vpp detector, according to the present invention.

Turning now to FIG. 14, a preferred embodiment of a Vdd/Vpp detector 265 is shown. The inclusion of detector 265 is desirable in that as flash memory usage continues to spread into the portable equipment market, a wide range of power supply voltages must be accommodated. For example, in some battery operated applications, Vdd may be as low as +1.8 V, but in other applications, Vpp≈+12 V may be available. The presence of detector 265 as shown in FIGS. 3 and 4 advantageously permits a knowledge of the external power supply magnitude to be communicated to the various other circuits described herein. In this fashion, such other circuitry may advantageously be trimmed as to optimize regulation and/or voltage detection operation.

In the embodiment of FIG. 14, the externally provided Vdd and/or Vpp (e.g., Vdd/Vpp) potentials are coupled to a resistor divider and are magnitude-divided to generate lesser magnitude signals, e.g., V1, V2, . . . Vm. These lesser magnitude signals are parallel-compared against VREF(P) by a plurality of comparator stages, e.g., 340-B1, 340B-2, . . . 340B-M.

Proper selection of resistors values R1, R2, . . . Rm+1 permit a chosen one of V1, V2, . . . Vm to equal VREF(P) when Vdd/Vpp is a desired magnitude. For example, if Vdd is 1.8 V, V1=VREF(P), when Vdd is 2.5 V, V2=VREF(P), and so forth. Detector circuit 265 will output signals Vdd/Vpp1-M" to precisely indicate to circuitry within IC 100 the magnitude of the externally provided power supply.

Modifications and variations may be made to the disclosed embodiments without departing from the subject and spirit of the invention as defined by the following claims.

What claimed is:

1. In an integrated circuit chip (IC) coupleable to a source of operating potential (Vdd), and including a plurality of solid state memory cells addressable in an array of sourcelines (SL), bitlines (BL) and wordlines (WL), and including at least one voltage pump coupleable to said Vdd to output at least a raw positive potential Vpp and a raw negative potential Vpn, an on-chip system for providing regulated potential to at least one node of a selected one of said cells, the system comprising:

a first regulator, coupled to receive a raw operating potential and to receive a source of reference voltage (VREF) and to output a regulated potential, said first regulator comprising:

a first comparator including at least a two-stage differential input differential output comparator whose first stage is coupled to receive said reference voltage and to receive a fraction (Vin) of regulated output potential, said first stage providing a differential output to differential inputs of a second stage of said comparator that outputs a signal VCMP proportional to difference between said VREF and said Vin;

a voltage controller, having an input node coupled to receive said VCMP signal, a power supply node coupled to receive said raw operating potential, and an output node providing said regulated potential;

wherein when said raw operating potential is said Vpp, said VREF is a positive potential VREF(P), and said first regulator outputs a regulated said Vpp; and when said raw operating potential is said Vpn, said VREF is a negative potential VREF(N), and said first regulator outputs a regulated said Vpn.

2. The system of claim 1, further including an on-chip reference voltage generator that outputs said VREF reference voltage, said reference voltage generator comprising:

a first PMOS device connected as a diode coupled in series with a first NMOS device, said first PMOS and first NMOS device being coupled between a first source of potential and a second source of potential;

a second PMOS device coupled in series with a second NMOS device that is connected as a diode, said second PMOS device having a first resistor connected in series between said first source of potential and a drain lead of said second PMOS device, said second PMOS device having a gate lead coupled to a gate lead of said first PMOS device; said second NMOS device having a gate lead coupled to a gate lead of said first NMOS device;

a third NMOS device having a gate lead coupled to said second source of potential, and having source and drain leads coupled together, and a fourth NMOS device coupled in series with a second resistor coupled to a source lead of said third NMOS device and having a source lead coupled to said second source of potential and a gate lead coupled to said gate lead of said first NMOS device;

wherein each said NMOS device is substantially identical and each said PMOS device is substantially identical;

wherein when said first source of potential is said Vdd and said second source of potential is ground, said VREF is a positive regulated potential VREF(P) obtained between said Vde and said drain of said fourth NMOS device, said VEF(P) voltage being substantially independent in magnitude of variation in said Vdd, in variation in ambient temperature, and in variation in fabrication process used to fabricate components in said reference voltage generator;

wherein when said first source of potential is ground, and said second source of potential is said Vpn, said VREF is a negative regulated potential VREF(N) obtained between said ground and said drain of said fourth NMOS device, said VEF(N) voltage being substantially independent in magnitude of variation in said Vdd, in variation in ambient temperature, and in variation in fabrication process used to fabricate components in said reference voltage generator.

3. The system of claim 1, wherein said first regulator includes a divider circuit coupled between an output of said voltage controller and ground, said divider circuit having an node providing a fraction of potential at said output of said voltage controller as said potential Vin.

4. The system of claim 3, wherein said divider circuit includes means for providing said fraction of potential without substantial attenuation of changes in potential at said output of said voltage controller.

5. The system of claim 3, wherein said divider circuit includes a first resistor and first switch coupled in series with a second resistor and second switch between said output of said voltage controller and ground, and a first capacitor coupled in series across said first resistor and first switch;

the first and second switches operating so as to establish a fraction of potential at said output of said voltage controller as said potential Vin, and to then remove said first resistor and said second resistor from said divider circuit, permitting said first capacitor to couple substantially unattenuated changes in said output of said voltage controller to said Vin;

wherein said divider circuit provides said fraction of potential without substantial attenuation of changes in potential at said output of said voltage controller and without conducting DC current.

6. The system of claim 3, wherein said divider circuit includes a first capacitor coupled in series with a second capacitor, said Vin potential appearing at a node between said first and second capacitor;

at least one of a free end of said first capacitor and said node being switchably coupled to a first DC potential;

a second end of said second capacitor being switchably coupled to said output of said voltage controller;

wherein said first capacitor and said second capacitor are switcheably coupled to said first DC potential and to said output of said voltage controller so as to establish a fraction of potential at said output of said voltage controller as said potential Vin, so as to permit said second capacitor to couple substantially unattenuated changes in said output of said voltage controller to said Vin;

wherein said divider circuit provides said fraction of potential without substantial attenuation of changes in potential at said output of said voltage controller and without conducting DC current.

7. The system of claim 1, wherein at least one stage in said first comparator includes:
a first PMOS transistor, connected as a diode, coupled in series with a first NMOS transistor between said Vdd and ground;
a second PMOS transistor coupled in series with a second NMOS transistor between said Vdd and ground, a gate lead of said second PMOS transistor being connected to a gate lead of said first PMOS transistor;
wherein a gate lead on said first NMOS transistor is a first input to said stage and a gate lead on said second NMOS transistor is a second input to said stage, and a source lead on said first PMOS transistor is a first output of said stage, and a source lead on said second PMOS transistor is a second output of said stage;
wherein said first PMOS transistor and said second PMOS transistor are substantially identical, and said first NMOS transistor and said second NMOS transistor are substantially identical.

8. The system of claim 1, wherein at least one stage in said first comparator includes:
a first PMOS transistor coupled in series with a first NMOS transistor between said Vdd and ground, said first NMOS transistor connected as a diode;
a second PMOS transistor coupled in series with a second NMOS transistor between said Vdd and ground, a gate lead of said second NMOS transistor being connected to a gate lead of said first NMOS transistor;
wherein a gate lead on said first PMOS transistor is a first input to said stage and a gate lead on said second PMOS transistor is a second input to said stage, and a source lead on said first PMOS transistor is a first output of said stage, and a source lead on said second PMOS transistor is a second output of said stage;
wherein said first PMOS transistor and said second PMOS transistor are substantially identical, and said first NMOS transistor and said second NMOS transistor are substantially identical.

9. The system of claim 1, wherein said voltage controller includes:
a low pass filter having an input node coupled to receive said VCMP potential from said output of said first comparator;
wherein when said first regulator is coupled to said raw Vpp and outputs said Vpp, said voltage controller further includes a first PMOS transistor coupled in series between said raw Vpp and said output of said voltage controller, a drain lead on said first PMOS transistor providing said output of said voltage controller, and having a gate lead coupled to an output of said low pass filter; a first NMOS transistor coupled in series with a second NMOS transistor between said drain lead of said first PMOS transistor and ground, said first NMOS transistor having a gate lead connected to ground, and said second NMOS transistor having a gate lead coupled to said gate lead of said first PMOS transistor; and
when said first regulator is coupled to said raw Vpn and outputs said Vpn, said voltage controller further includes a first NMOS transistor coupled in series between said raw Vpn potential and said output of said voltage controller, a drain lead on said first NMOS transistor providing said output of said voltage controller, and having a gate lead coupled to an output of said low pass filter; a first PMOS transistor coupled in series with a second PMOS transistor between said drain lead of said first NMOS transistor and said Vdd, said first PMOS transistor having a gate lead connected to ground, and said second PMOS transistor having a gate lead coupled to said gate lead of said first NMOS transistor.

10. The system of claim 6, wherein said voltage control includes:
a sample and hold circuit having an input node coupled to receive said VCMP signal;
a low pass filter, having an input node coupled to receive an output signal from said sample and hold circuit;
at least one MOS transistor coupled in series between a source of raw operating potential greater in magnitude than a desired output of said first voltage regulator and said output of said voltage controller, a drain lead of said MOS transistor providing said output of said voltage controller, said MOS transistor having a gate lead coupled to an output node of said low pass filter;
wherein said sample and hold circuit stabilizes magnitude of regulated output voltage from said first regulator in the presence of said switchably coupling of said divider circuit.

11. The system of claim 1, wherein said first regulator outputs said Vpp; the system further including a sourceline (SL) regulator comprising:
a second comparator including at least a differential input differential output first stage;
said first stage having a first input node coupled to a drain lead of a first VREF NMOS device having a source lead coupled to ground, and a gate lead coupled to a source of VREF potential substantially equal in magnitude to a desired SL potential;
said first stage including a plurality of NMOS devices substantially identical to said first VREF NMOS device, each of said plurality of NMOS devices having a drain lead coupled to a second input node of said first stage, having a source lead coupled to ground, and having a gate lead coupled to a SL in said array;
wherein a selected SL will be at a high SL potential and unselected SLs will be a ground potential such that only one of said NMOS devices will be active, an active one of said NMOS devices being coupled to a selected SL whose SL potential is to be regulated;
a voltage controller having at least a MOS device having a source lead coupled to said Vpp and a drain lead providing regulated SL potential to a selected SL in said array, and having a gate lead coupled to an output of said second comparator;
wherein an active one of said NMOS devices has a drain lead that feeds-back SL node potential to said second comparator; and
wherein said second comparator operates so as to minimize discrepancy between said VREF and fedback SL potential, wherein said SL potential for a selected said SL is regulated.

12. The system of claim 11, wherein said first stage of said second comparator includes:
a first PMOS device connected as a diode and having a drain lead coupled to said Vdd, and a second, substantially identically PMOS device having a drain lead coupled to said Vdd, a gate lead coupled to a date lead of said first PMOS device; and a source lead coupleable as said second input node to drain leads of said NMOS devices;

wherein said first VREF NMOS device is coupled to a drain lead of said first PMOS device as said first input node;

wherein a source lead of said first PMOS device is a first output of said first stage, and a source lead of said second PMOS device is a second output of said first stage.

13. The system of claim 12, wherein said second comparator further includes at least a second stage, differential coupled to receive as inputs said first output and said second output of said first stage, said second stage including:

a third PMOS transistor coupled in series with a third NMOS transistor between said Vdd and ground, said third NMOS transistor connected as a diode;

a fourth PMOS transistor coupled in series with a fourth NMOS transistor between said Vdd and ground, a gate lead of said fourth NMOS transistor being connected to a gate lead of said third NMOS transistor;

wherein a gate lead on said third PMOS transistor is a first input to said second stage and a gate lead on said fourth PMOS transistor is a second input to said second stage, and a source lead on said third PMOS transistor is a first output of said second stage, and a source lead on said fourth PMOS transistor is a second output of said second stage;

wherein said PMOS transistor is substantially identical, and each NMOS transistor is substantially identical.

14. The system of claim 1, wherein said first regulator outputs said Vpp; the system further including a bitline (BL) regulator comprising:

a second comparator including at least a differential input differential output first stage;

said first stage having a first input node coupled to a drain lead of a first VREF NMOS device having a source lead coupled to ground, and a gate lead coupled to a source of VREF potential substantially equal in magnitude to a desired SL potential;

said first stage including a plurality of NMOS devices substantially identical to said first VREF NMOS device, each of said plurality of NMOS devices having a drain lead coupled to a second input node of said first stage, having a source lead coupled to ground, and having a gate lead coupled to a BL in said array;

wherein a selected BL will be at a high BL potential and unselected BLs will be a ground potential such that only one of said NMOS devices will be active, an active one of said NMOS devices being coupled to a selected BL whose BL potential is to be regulated;

a voltage controller having at least a MOS device having a source lead coupled to said Vpp and a drain lead providing regulated BL potential to a selected BL in said array, and having a gate lead coupled to an output of said second comparator;

wherein an active one of said NMOS devices has a drain lead that feeds-back BL node potential to said second comparator; and wherein said second comparator operates so as to minimize discrepancy between said VREF and fedback BL potential, wherein said BL potential for a selected said BL is regulated.

15. The system of claim 14, wherein said first stage of said second comparator includes:

a first PMOS device connected as a diode and having a drain lead coupled to said Vdd, and a second, substantially identically PMOS device having a drain lead coupled to said Vdd, a gate lead coupled to a date lead of said first PMOS device; and a source lead coupleable as said second input node to drain leads of said NMOS devices;

wherein said first VREF NMOS device is coupled to a drain lead of said first PMOS device as said first input node;

wherein a source lead of said first PMOS device is a first output of said first stage, and a source lead of said second PMOS device is a second output of said first stage.

16. The system of claim 15, wherein said second comparator further includes at least a second stage, differential coupled to receive as inputs said first output and said second output of said first stage, said second stage including:

a third PMOS transistor coupled in series with a third NMOS transistor between said Vdd and ground, said third NMOS transistor connected as a diode;

a fourth PMOS transistor coupled in series with a fourth NMOS transistor between said Vdd and ground, a gate lead of said fourth NMOS transistor being connected to a gate lead of said third NMOS transistor;

wherein a gate lead on said third PMOS transistor is a first input to said second stage and a gate lead on said fourth PMOS transistor is a second input to said second stage, and a source lead on said third PMOS transistor is a first output of said second stage, and a source lead on said fourth PMOS transistor is a second output of said second stage;

wherein said PMOS transistor is substantially identical, and each NMOS transistor is substantially identical.

17. The system of claim 14, further including a circuit to vary regulated said BL potential as a function of array location of a selected said cell such that ohmic losses associated with said cell are at least partially compensated for, said circuit including:

a plurality of programmable voltage dividers each coupleable between said Vpp and ground, an output node of a selected one of said voltage dividers outputting said VREF;

a plurality of logic circuits, each having at least two inputs coupleable to select signals from a Y-select gate unit present on said IC chip, and each having an output coupled to one of said programmable voltage dividers;

wherein said logic circuits program said dividers such that VREF varies in magnitude with array location of a selected said cell;

wherein variation in said VREF produces variation in said BL potential.

18. The system of claim 14, further including means for varying regulated said BL potential as a function of array location of a selected said cell so as to at least partially compensate for ohmic losses associated with said cell.

19. The system of claim 1, further including a positive wordline (WL) regulator coupled to receive said Vpp potential or a fraction of said Vpp potential, and to output a positive WL(P) potential, the positive WL regulator comprising:

a resistor divider series coupled between said Vpp potential and ground, and having a plurality of divider nodes whereat progressively larger fractions of said Vpp potential are present;

a first plurality of NMOS devices, each of said NMOS devices having a gate lead coupled to one of said divider nodes, having a source lead coupled to ground, and having a drain lead coupled to a source lead of an associated enabling NMOS transistor having a gate lead coupled to receive an enabling signal and having a drain lead;

a second plurality of NMOS devices substantially similar in characteristics to said first plurality of NMOS devices, each of said NMOS devices having a gate lead coupled to a WL in said array, having a source lead coupled to ground, and having a drain lead coupled to a source lead of a node enabling WL NMOS device having a gate lead coupled to receive an enabling signal and having a drain lead;

a multi-stage differential input differential output comparator having a first stage with a first input coupled to each drain lead of an associated said enabling NMOS transistor, and having a second input coupled to said drain lead of said enabling WL NMOS device; said comparator providing a regulated WL output voltage coupled to an X-decoder on said IC chip, said X-decoder being coupled to WLs in said array;

wherein a selected said WL is forced to a WL potential equal to a fraction of said Vpp potential at a said divider node.

20. The system of claim 19, further including a circuit to vary magnitude of said VPP potential such that a sequence of regulated WL potentials is generated by said positive WL regulator;

wherein if said array includes multiple level memory (MLC) cells said sequence of regulated WL potentials permits reading contents of said MLC cells.

21. The system of claim 19, wherein said multistage differential input differential output comparator includes at least a second stage, differential coupled to receive as inputs said first output and said second output of said first stage, said second stage including:

a third PMOS transistor coupled in series with a third NMOS transistor between said Vdd and ground, said third NMOS transistor connected as a diode;

a fourth PMOS transistor coupled in series with a fourth NMOS transistor between said Vdd and ground, a gate lead of said fourth NMOS transistor being connected to a gate lead of said third NMOS transistor;

wherein a gate lead on said third PMOS transistor is a first input to said second stage and a gate lead on said fourth PMOS transistor is a second input to said second stage, and a source lead on said third PMOS transistor is a first output of said second stage, and a source lead on said fourth PMOS transistor is a second output of said second stage;

wherein said PMOS transistor is substantially identical, and each NMOS transistor is substantially identical.

22. The system of claim 1, further including a negative wordline (WL) regulator coupled to receive said Vpn potential or a fraction of said Vpn potential, and to output a negative WL(N) potential, the negative WL regulator comprising:

a resistor divider series coupled between said Vpn potential and ground, and having a plurality of divider nodes whereat progressively larger fractions of said Vpn potential are present;

a first plurality of PMOS devices, each of said PMOS devices having a gate lead coupled to one of said divider nodes, having a source lead coupled to said Vdd, and having a drain lead coupled to a source lead of an associated enabling PMOS transistor having a gate lead coupled to receive an enabling signal and having a drain lead;

a dummy PMOS device having a source lead coupled to said Vdd, having a gate lead coupled to a dummy WL coupled to an X-decoder on said IC chip, and having a drain lead coupled to a source lead of an associated enabling dummy PMOS transistor having a gate lead coupled to receive a dummy enabling signal, and having a drain lead;

wherein each of said PMOS devices is substantially identical in characteristics;

a multi-stage differential input differential output comparator having a first stage with a first output lead coupled to each drain lead of an associated said enabling PMOS transistor, and having a second output lead coupled to said drain lead of said enabling dummy PMOS transistor; said comparator providing a regulated WL output voltage coupled to said X-decoder, said X-decoder being coupled to WLs in said array;

wherein said dummy WL emulates in characteristics a selected said WL, a said selected WL being forced to a WL potential equal to a fraction of said Vpn potential at a said divider node.

23. The system of claim 22, wherein said first stage of said multi-stage differential input differential output comparator includes first NMOS device connected as a diode and a second NMOS device, each said NMOS device having a source lead coupled to ground, a gate lead of said first NMOS device being coupled to a gate lead of said second NMOS device, a drain of said first NMOS device being said first output lead, and a drain of said second NMOS device being said second output lead.

24. The system of claim 23, wherein said differential input differential output comparator includes at least a second stage, differential coupled to receive as inputs said first output and said second output of said first stage, said second stage including:

a third PMOS transistor coupled in series with a third NMOS transistor between said Vdd and ground, said third NMOS transistor connected as a diode;

a fourth PMOS transistor coupled in series with a fourth NMOS transistor between said Vdd and ground, a gate lead of said fourth NMOS transistor being connected to a gate lead of said third NMOS transistor;

wherein a gate lead on said third PMOS transistor is a first input to said second stage and a gate lead on said fourth PMOS transistor is a second input to said second stage, and a source lead on said third PMOS transistor is a first output of said second stage, and a source lead on said fourth PMOS transistor is a second output of said second stage;

wherein said PMOS transistor is substantially identical, and each NMOS transistor is substantially identical.

25. The system of claim 1, further including a wordline (WL) detector, comprising:

a voltage divider coupled between said Vpp and ground and defining a number M of divider nodes whereat progressively larger fractions of said Vpp potential are present;

a multi-stage differential comparator having a first stage that includes a first input coupleable to receive a voltage proportional to a selected WL voltage, and includes a second input coupleable to receive a voltage proportional to voltage at at least one of said divider nodes, said comparator having a plurality of second stages each coupled to receive differential output signals from said first stage;

wherein said second stages change state independently of each other in response to changes in potential of a selected WL;

wherein said WL detector is operable even if said array includes multiple level memory (MLC) cells.

26. The system of claim 25, wherein WL potential is slewed in at least one method selected from the group consisting of (a) said WL potential is ramped-up, (b) said WL potential is ramped-down, (c) said WL potential is stair-stepped up, and (d) said WL potential is stair-stepped down.

27. The system of claim 25, wherein said first stage of said comparator includes:

a first PMOS device connected as a diode and a second PMOS device, said first PMOS device and said second PMOS device each having a coupled-together gate lead, a drain lead coupled to said Vdd, and a source lead;

a first plurality of NMOS devices each having a gate lead coupled to a WL in said array, each having a source lead coupled to ground, and each having a drain lead coupleable to said first input;

a second plurality of NMOS devices substantially identical in characteristics to said first plurality of NMOS devices, said second plurality equalling in number said M, each of said M NMOS devices having a gate lead coupled to one of said divider nodes, having a source lead coupled to ground, and having a drain lead coupleable to a first input of one of said second stages;

each of said second stages having a second input coupled to a first of said differential output signals of said first stage.

28. The system of claim 1, further including a magnitude circuit to detect magnitude of at least one of said Vdd and said Vpp, said magnitude circuit including:

a voltage divider coupled between said Vdd or said Vpp and ground and defining a number M of divider nodes whereat progressively larger fractions of said Vdd or said Vpp potential are present;

a multi-stage differential comparator having a first stage that includes a first input coupleable to receive a voltage proportional to a reference voltage, and that includes a second input coupleable to receive a voltage proportional to voltage at at least one of said M divider nodes, said comparator having a plurality of second stages each coupled to receive differential output signals from said first stage;

wherein said second stages change state independently of each other in response to magnitude of said Vdd or said Vpp;

wherein an output signal from at least one of said second states provides a signal proportional to magnitude of said Vdd or said Vpp, said output signal being coupleable for at least one use selected from the group consisting of (a) to help regulate at least one voltage regulator on said IC chip, and (b) to disable at least one voltage pump on said IC chip whose output voltage is not required because a detected magnitude of said Vdd or said Vpp is sufficiently high to be substituted for said voltage pump output voltage.

29. The system of claim 5, wherein said divider circuit includes means for using a polarity for said VREF opposite to a polarity of said Vpp or said Vpn.

30. The system of claim 6, wherein said divider circuit includes means for using a polarity for said VREF opposite to a polarity of said Vpp or said Vpn.

31. In an integrated circuit chip (IC) coupleable to a source of operating potential (Vdd), and including a plurality of solid state memory cells addressable in an array of sourcelines (SL), bitlines (BL) and wordlines (WL), and including at least one voltage pump coupleable to said Vdd to output at least a raw positive potential Vpp and a raw negative potential Vpn, an on-chip system for providing regulated potential to at least one node of a selected one of said cells, the system comprising:

a precision VREF(P) generator outputting a precise positive VREF(P) voltage;

a precision VREF(N) generator outputting a precise negative VREF(N) voltage;

a Vpp regulator coupled to receive said raw Vpp and at least one of said VREF(P) voltage and said VREF(N), and outputting a positive regulated Vpp voltage;

a Vpn regulator coupled to receive said raw Vpn and at least one of said VREF(N) voltage and said VREF(P) voltage, and outputting a negative regulated Vpn voltage;

a BL regulator, coupled to receive said regulated Vpp voltage and providing regulated BL potential to Bls in said array, and including at least one feedback loop from at least one selected BL node in said array, said BL regulator including a multi-stage differential input differential output comparator comparing voltage feedback from said at least one selected BL node to an on-chip generated reference voltage to generate said regulated BL potential; and a SL regulator, coupled to receive said regulated Vpp voltage and providing regulated SL potential to SLs in said array, and including at least one feedback loop from at least one selected SL node in said array, said SL regulator including a multi-stage differential input differential output comparator comparing voltage feedback from said at least one selected SL node to an on-chip reference voltage to generate said regulated SL potential.

32. The system of claim 31, further including at least one circuit selected from the group consisting of (a) a circuit to vary BL potential output by said BL regulator to compensate for ohmic losses associated with location of addressed cells in said array, and (b) a circuit to vary SL potential output by said SL regulator to compensate for ohmic losses associated with location of addressed cells in said array.

33. The system of claim 31, further including:

a positive WL regulator coupled to receive voltage proportional to said regulated Vpp, and providing regulated positive WL potentials to WLs in said array, and including at least one feedback loop from at least one selected WL node in said array, said positive WL regulator including a multi-stage differential input differential output comparator comparing voltage feedback from said at least one selected WL node to an on-chip reference voltage to generate said regulated positive WL potentials; and a negative WL regulator coupled to receive said regulated Vpn, and providing regulated negative WL potentials to WLs in said array, and including at least one feedback loop from at least one selected WL node in said array, said negative WL regulator including a multi-stage differential input differential output comparator comparing voltage fedback from a dummy WL to at least a fraction of said Vpn voltage to generate said regulated negative WL potentials.

34. The system of claim 33, further including a WL detector and a detector of a magnitude of said Vdd or said Vpp potential.

* * * * *